United States Patent
Billingsley et al.

(10) Patent No.: US 10,090,662 B2
(45) Date of Patent: Oct. 2, 2018

(54) POWER MONITORING AND MANAGEMENT WITH REMOTE ACCESS

(75) Inventors: Richard J. Billingsley, Rossland (CA); Robert A. Dawley, Creedmoor, NC (US); Andrew Benton, Blue Bell, PA (US)

(73) Assignee: Electronic Systems Protection, Inc., Knightdale, NC (US)

(*) Notice: Subject to any disclaimer, the term of this patent is extended or adjusted under 35 U.S.C. 154(b) by 838 days.

(21) Appl. No.: 13/436,103

(22) Filed: Mar. 30, 2012

(65) Prior Publication Data

US 2012/0221161 A1 Aug. 30, 2012

Related U.S. Application Data

(63) Continuation-in-part of application No. 13/198,137, filed on Aug. 4, 2011, now Pat. No. 8,520,349.

(Continued)

(51) Int. Cl.
*G06F 1/26* (2006.01)
*H02H 3/00* (2006.01)
(Continued)

(52) U.S. Cl.
CPC ....... *H02H 3/006* (2013.01); *G01R 19/16547* (2013.01); *G01R 19/16576* (2013.01); *H01H 9/541* (2013.01); *H01H 9/56* (2013.01)

(58) Field of Classification Search
CPC .................................................. G01R 19/165
(Continued)

(56) References Cited

U.S. PATENT DOCUMENTS

| 4,206,443 A | 6/1980 | Britton |
| 4,414,601 A | 11/1983 | Conroy, Jr. |

(Continued)

FOREIGN PATENT DOCUMENTS

| EP | 2071701 A1 | 6/2009 |
| EP | 2325988 A1 | 5/2011 |

(Continued)

OTHER PUBLICATIONS

Extended Search Report and search opinion in counterpart European Application No. 12004394.8, dated Aug. 7, 2012.

(Continued)

*Primary Examiner* — Mark Connolly
(74) *Attorney, Agent, or Firm* — Edell, Shapiro & Finnan LLC

(57) ABSTRACT

A supply voltage monitor includes a switch circuit that enables coupling of an AC power supply to a load. A control circuit switches the switch circuit from a non-conductive state to a conductive state, and vice-versa, based upon a state of a state machine implemented by the control circuit, and further reports anomalies in process variables, such as voltage and current levels, temperature, etc., based on the state of the state machine. The transition criteria that is met to compel a transition in state is selectable by a user by way of a user interface. The transition criteria may correspond to different power levels that define a range over which the power is considered nominal and a range over which the power is considered to be an anomaly. The transition criteria additionally define what type of anomalies are reported without a change in the conductivity of the switch circuit.

25 Claims, 16 Drawing Sheets

Related U.S. Application Data

(60) Provisional application No. 61/535,170, filed on Sep. 15, 2011, provisional application No. 61/438,022, filed on Jan. 31, 2011.

(51) Int. Cl.
  *G01R 19/165* (2006.01)
  *H01H 9/54* (2006.01)
  *H01H 9/56* (2006.01)

(58) Field of Classification Search
  USPC .......................................... 700/295
  See application file for complete search history.

(56) References Cited

U.S. PATENT DOCUMENTS

| | | | |
|---|---|---|---|
| 5,136,455 A | | 8/1992 | Billingsley |
| 5,440,441 A | | 8/1995 | Ahuja |
| 5,602,462 A | * | 2/1997 | Stich et al. ................ 323/258 |
| 5,721,661 A | | 2/1998 | Mechanic |
| 5,956,222 A | | 9/1999 | Wittner et al. |
| 5,982,596 A | | 11/1999 | Spencer et al. |
| 6,040,969 A | | 3/2000 | Winch et al. |
| 6,118,639 A | | 9/2000 | Goldstein |
| 6,229,682 B1 | | 5/2001 | Mechanic |
| 6,560,086 B2 | | 5/2003 | Mechanic |
| 6,728,089 B2 | | 4/2004 | Harford |
| 6,744,613 B2 | | 6/2004 | McCook et al. |
| 6,885,215 B1 | * | 4/2005 | Hou et al. ................ 324/764.01 |
| 6,947,266 B1 | | 9/2005 | Billingsley |
| 6,956,725 B2 | | 10/2005 | Boughton, Jr. et al. |
| 7,068,487 B2 | | 6/2006 | Harford |
| RE39,446 E | | 12/2006 | Winch et al. |
| 7,184,252 B2 | | 2/2007 | Harford |
| 7,511,934 B2 | | 3/2009 | Benton et al. |
| 7,518,265 B2 | * | 4/2009 | Roepke ............................ 307/64 |
| 7,541,696 B2 | | 6/2009 | Dawley |
| 7,551,412 B2 | | 6/2009 | Winch |
| 8,290,710 B2 | * | 10/2012 | Cleland et al. .................... 702/4 |
| 2005/0206241 A1 | * | 9/2005 | Saxena et al. .................. 307/66 |
| 2007/0194942 A1 | | 8/2007 | Darr |
| 2008/0019068 A1 | | 1/2008 | Reynolds et al. |
| 2008/0247105 A1 | | 10/2008 | Divan |
| 2008/0258709 A1 | | 10/2008 | Shuey |
| 2009/0102294 A1 | | 4/2009 | Hodges et al. |
| 2009/0116158 A1 | | 5/2009 | Graves et al. |
| 2009/0150818 A1 | * | 6/2009 | Bakhreiba et al. ............. 715/771 |
| 2009/0195349 A1 | * | 8/2009 | Frader-Thompson et al. ............... 340/3.1 |
| 2009/0198384 A1 | * | 8/2009 | Ahn ........................ G01D 4/004 700/292 |
| 2009/0230779 A1 | * | 9/2009 | Ryan et al. .................... 307/125 |
| 2009/0303648 A1 | * | 12/2009 | Benton et al. .................. 361/90 |
| 2010/0127881 A1 | * | 5/2010 | Schechter .......... H05K 7/20836 340/584 |
| 2010/0164749 A1 | * | 7/2010 | Hope .................. H02J 13/0062 340/870.02 |
| 2010/0313270 A1 | * | 12/2010 | Kim et al. ...................... 726/24 |
| 2011/0063759 A1 | | 3/2011 | Billingsley et al. |
| 2011/0313583 A1 | | 12/2011 | Lin |
| 2014/0245036 A1 | * | 8/2014 | Oishi .................. H04B 5/0037 713/300 |

FOREIGN PATENT DOCUMENTS

WO 2007143576 A2 12/2007
WO 2009082484 A1 7/2009

OTHER PUBLICATIONS

Office Action in corresponding European Application No. 12004395.8, dated Jan. 5, 2015.

* cited by examiner

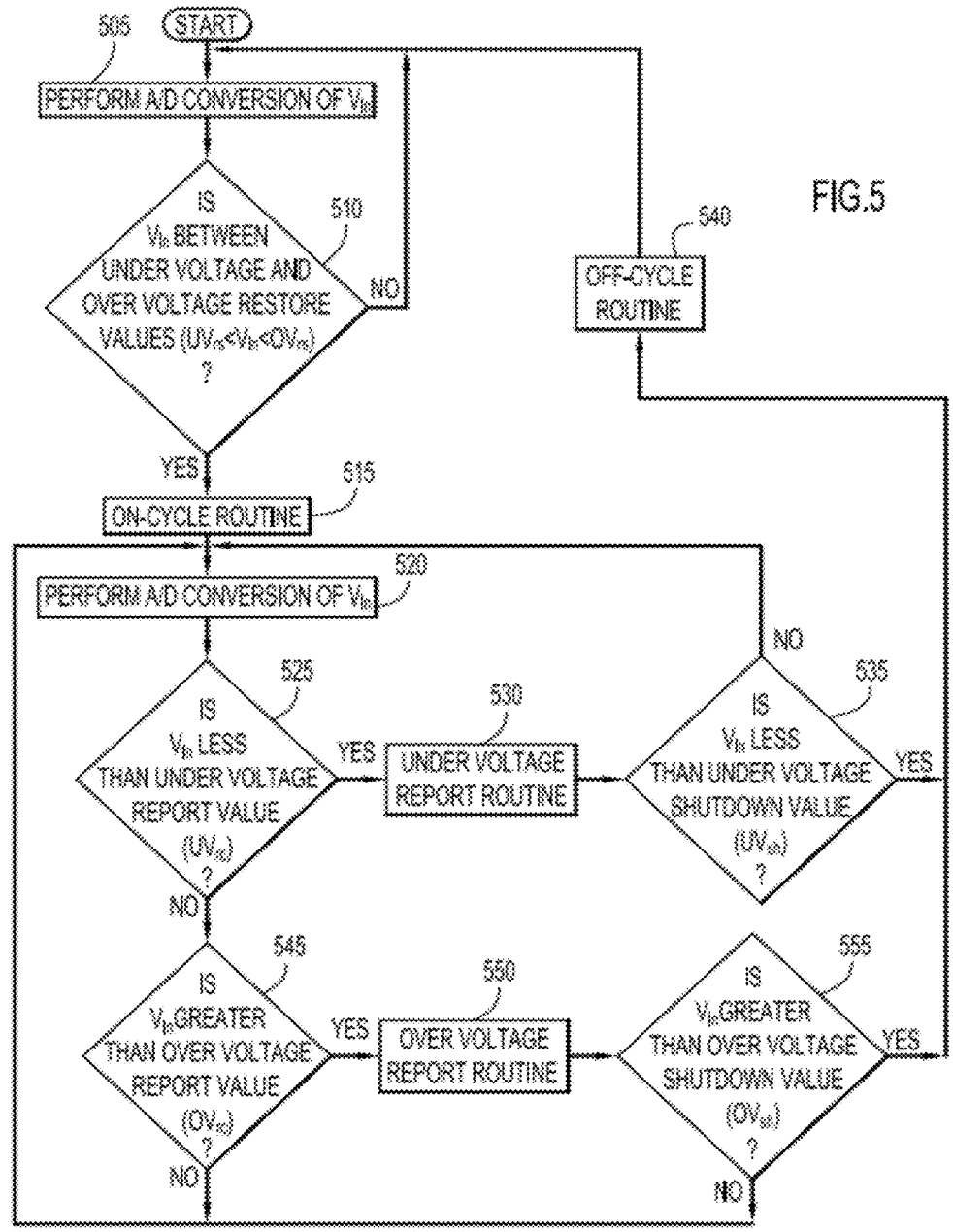

POWER MONITORING AND MANAGEMENT WITH REMOTE ACCESS

RELATED APPLICATION DATA

This application is a Continuation-in-Part (CIP) of U.S. patent application Ser. No. 13/198,137, filed Aug. 4, 2011 and entitled "Supply Voltage Monitor," which claims priority under 35 U.S.C. § 119(e) from U.S. Provisional Patent Application No. 61/438,022 entitled "Supply Voltage Monitor," filed Jan. 31, 2011. The disclosure of this U.S. patent application is incorporated herein by reference in its entirety. This application also claims priority under 35 U.S.C. § 119(e) from U.S. Provisional Patent Application No. 61/535,170 entitled "Power Monitoring and Management with Remote Access," filed Sep. 15, 2011. The disclosure of this U.S. Provisional patent application is also incorporated herein by reference in its entirety.

BACKGROUND

Many available power protection devices, such as surge protection devices (SPDs) and hybrid filters, include an automatic switch circuit that disconnects AC power to the device output in response to various supply wiring fault and/or over voltage or under voltage conditions, referred to herein as power anomalies. Circuitry that detects over voltage and under voltage conditions requires nominal line voltage levels before AC power is passed to the device output and connected equipment. Line voltage conditions, such as surges and over voltages, can cause failure of certain power protection device components, such as metal oxide varistors and other suppressor components. In addition, some equipment power supplies can be damaged by surges or persistent over voltage conditions.

Despite the benefits of power protection devices that disconnect power from equipment in response to power anomalies, the resulting power disruptions can be inconvenient or problematic. To avoid frequent power interruptions, one solution would be to set the voltage levels at which power is disconnected well outside the normal operation range, but still within levels tolerated by the equipment. However, this approach may result in frequent or chronic over voltage or under voltage conditions of lesser magnitude going undetected indefinitely, which may eventually lead to damage to the surge protection device or the connected equipment. Accordingly, there remains a need for a supply voltage monitoring system that provides over voltage and under voltage protection without causing frequent power disruptions while still providing adequate notification of lesser-magnitude over voltage and under voltage conditions that may indicate a problem condition within the system or with the connected equipment. Additionally, as such persistent power anomalies should be adequately conveyed to appropriate personnel, the need for remote access and control of monitoring equipment is also felt.

SUMMARY

The general inventive concept disclosed herein is directed to power monitoring and control over one or more power monitor devices. Such a power monitor includes input terminals at which input power is received and output terminals at which output power is provided to a load. A switch circuit between the input and output terminals may be activated into a conductive state or a non-conductive state in response to a detected power anomaly. An access device may communicate with the power monitor to provide action criteria data that define boundaries between degrees of power anomalousness. That is, one boundary of power anomalousness may cause a report to be generated and provided to the access device while another level of power anomalousness may cause not only the generation of the report, but also a transition of the switch circuit from the conductive state to the non-conductive state. Both the power monitor and the access device include a communication module between which a communication channel is formed to carry the action criteria data and the report data therebetween.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

FIG. 5 depicts a functional flow diagram of another example of logic for implementing operation of the monitoring device of FIG. 1 in response to supply voltage conditions;

DETAILED DESCRIPTION

Figure 1:
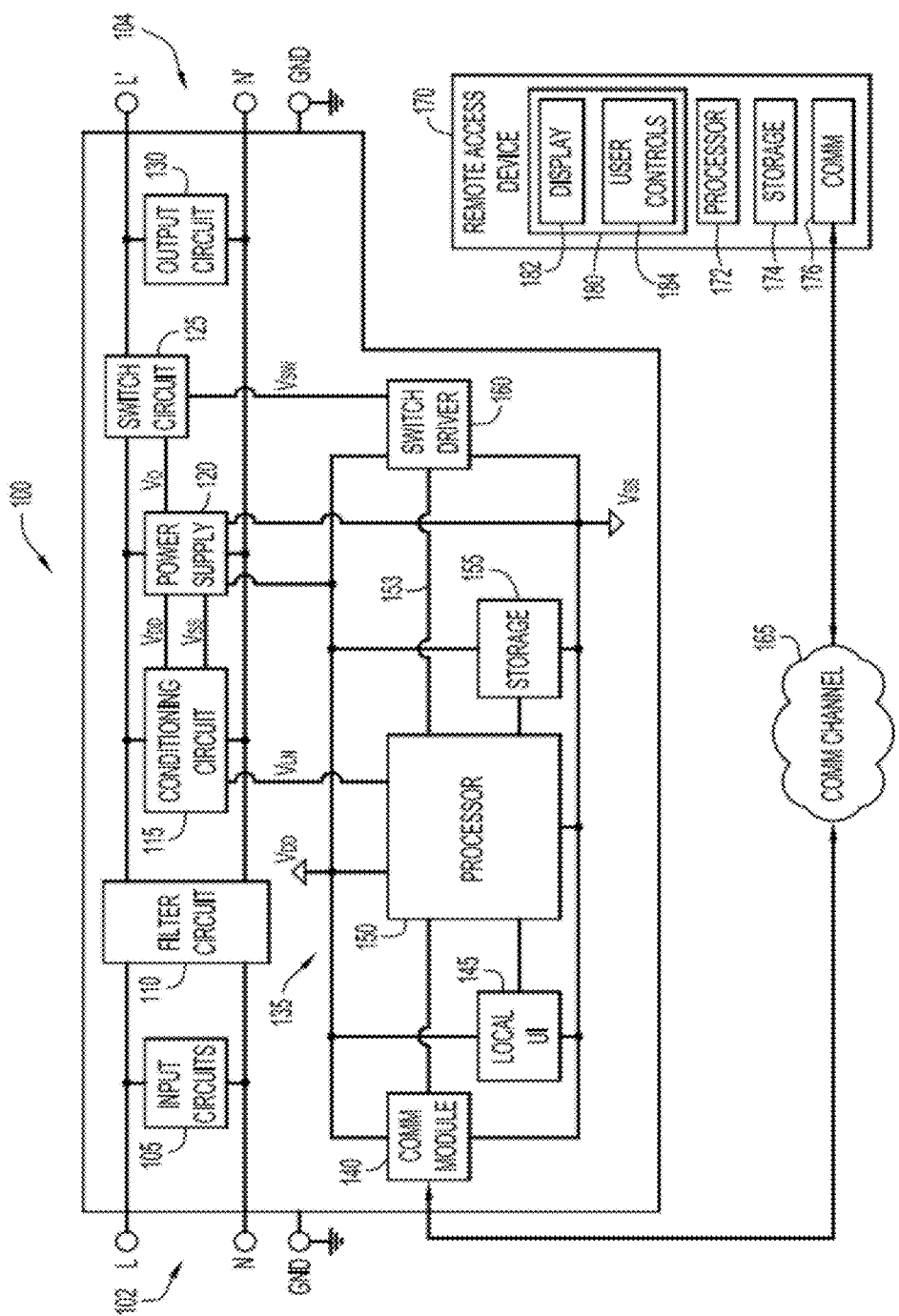
FIG. 1 is a block diagram of an embodiment of a power monitoring device capable of selectively connecting an AC power supply to load equipment and an access device by which control data may be provided to the monitor.

The present inventive concept is best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

The supply power monitor described herein evaluates physical qualities, for example, supply voltage and/or current of an AC supply coupled to load equipment, temperature, power consumption, supply/load polarity correspondence, etc., against one or more criteria and may perform one or more actions depending on which, if any, of the criteria have been met. Such physical qualities are referred to herein as process variables, the measured values (for which) are evaluated against action criteria to determine whether a corresponding action is to be taken, such as changing power delivery to a load, generating reports, generating audio and/or visual alarms, and so on. As used herein, an event occurs when the value of a process variable meets the action criteria, i.e., an event results in the corresponding action being taken. For example, if a measured value of AC supply voltage (an exemplary process variable) exceeds a "report" over voltage threshold, (an exemplary action criteria), the event is reported (an exemplary action) in a manner by which the presence of a problem condition can be ascertained. Event reporting, as used herein, refers to providing information regarding an event to an entity external to the monitor. Such reporting may be achieved through a user interface by which event data may be viewed in real time, or by which archived event data can be retrieved from a data store, such as a digital memory device, and subsequently displayed.

If the AC supply voltage exceeds a "shutdown" over voltage threshold, which may be greater than the report over voltage threshold, the event is reported and the load equipment is electrically disconnected from the AC supply so as to protect not only the load equipment, but also components of the monitoring device itself. Likewise, if the AC supply voltage falls below a "report" under voltage threshold and if the AC supply voltage falls below an even lower "shutdown" under voltage threshold, the event is reported and the equipment is electrically disconnected from the AC supply. In this manner, the load equipment and the monitoring device are immediately protected from serious over voltage and under voltage conditions, while lesser over voltage and under voltage conditions can be reported without causing an immediate power disruption. Thus, if persistent under-voltage and over-voltage conditions are observed that do meet criteria that would necessitate equipment shutdown, the reporting of such informs, say, a system technician who can eventually apply corrective measures at a convenient time. It is to be understood that the present invention is not limited to a particular set of events; other event types are exemplified below.

FIG. 1 is a block diagram of an embodiment of a power monitoring device, or simply monitor, 100 capable of selectively connecting an AC power supply to load equipment. Power monitoring device 100 can be incorporated into a wide range of power protection and conditioning devices, such as surge protection devices (SPDs) and hybrid filters that perform a variety of other functions for ensuring delivery of reliable power to load equipment. Additionally, whereas a single-phase AC configuration is illustrated and described herein, the present invention can be similarly implemented in multi-phase equipment, as the ordinarily skilled artisan will recognize and appreciate upon review of this disclosure.

As shown in FIG. 1, on the supply side 102, input line L, neutral N, and ground GND terminals of monitor 100 are configured to be coupled to corresponding terminals of an AC power supply system (e.g., the terminals can be implemented as a plug configured to be inserted into a standard branch circuit receptacle. On the load side 104, output line L', neutral N', and ground terminals GND are configured to be coupled to corresponding terminals of one or more load devices. Line and neutral conductors of monitor 100 provide paths between the input and output line and neutral terminals, respectively.

A switch circuit 125 is disposed along the line conductor path and selectively couples an input (supply) line conductor L to an output (load) line conductor L' between the input and output line terminals. In a conductive state, switch circuit 125 electrically connects the input line conductor L to the output line conductor L' and, in a non-conductive state, switch circuit 125 electrically disconnects the input line conductor L from the output line conductor L'. Switch circuit 125 can be implemented using any of a wide variety of switching mechanisms. As one option, switch circuit 125 is implemented by an electromagnetic relay (EMR) in which an applied relay coil voltage closes normally-open relay contacts to selectively make or break continuity between the input and output line conductors. As another option, switch circuit 125 can be implemented with a power semiconductor, such as a triac. As yet another option, switch circuit 125 can be implemented by a hybrid switch circuit involving a parallel combination of a power semiconductor and an electromagnetic relay, such as that described in U.S. Patent Application Publication No. 2011/0063759, the disclosure of which is hereby incorporated by reference in its entirety. In this configuration, zero cross switching can be realized with minimal on-state voltage drop and power dissipation. Through the foregoing and other options, embodiments of the invention can protect vulnerable downstream device output circuit components (e.g., metal oxide varistors (MOVs) and other suppressor components) from over voltage and under voltage related damage. In addition to protecting vulnerable device components, embodiments of the present invention can also protect connected equipment that might otherwise be damaged by over voltage or under voltage conditions.

While switch circuit 125 is illustrated in FIG. 1 as interposed between the input and output line conductors, optionally a switch circuit controlled in the same manner may be interposed between input and output neutral conductors or such switches may be placed in both the line and neutral paths of monitor 100.

A supply signal conditioning circuit 115 may be coupled to input line L and neutral N conductors of monitor 100 to generate a supply voltage signal $V_{In}$ that is representative of the input line-to-neutral voltage. The supply voltage signal $V_{In}$, an exemplary process variable, is generated in a manner that affords evaluation and processing by a machine, such as a microprocessor or microcontroller. For example, for a processor expecting to receive an AC voltage signal, supply signal conditioning circuit 115 may generate supply voltage signal $V_{In}$ as a stepped-down version of the line-to-neutral voltage, such as through a transformer. For a processor expecting to receive a DC voltage signal, supply signal conditioning circuit 115 may generate the supply voltage signal $V_{In}$ as a DC signal (e.g., an analog signal) the value of which lies in an operating range of the processor and is proportional to the peak or average supply line-to-neutral voltage, as per the requirements of the implementation in which the invention is embodied. For example, supply signal conditioning circuit 115 may be a simple voltage divider, the output voltage of which may be converted through a differential analog-to-digital (A/D) converter. Conditioning circuit 115 may thus generate numerical sample data on which various digital processing operations may be performed. It is to be understood that while the embodiment described herein utilizes the supply line-to-neutral voltage $V_{ln}$ to detect over voltage and under voltage conditions, a signal representative of the line-to-ground voltage $V_{lg}$ may also be used for this purpose.

A power supply circuit 120 may be coupled between supply-side 102 and load side 104 to generate DC voltages from which other components in monitor 100 draw operating power. In the example illustrated in FIG. 1, DC power supply voltages $V_{DD}$ and $V_{SS}$ are generated and supplied to control circuit 135 and conditioning circuit 115, while another DC power supply voltage $V_O$ is generated and supplied to switch circuit 125 as an operating and/or bias voltage. Power supply 120 may be implemented by a regulated DC power supply that maintains its DC output at or near a nominal level in the presence of variations in the AC input voltage.

The input port 102 and output port 104 of monitor 100 may include other circuitry, generically illustrated at input circuits 105 and output circuits 130, respectively, and at filter circuit 110. Input circuits 105 may include a diverter stage connected to the input line, neutral, and ground conductors, coupled to filter circuit 110. The diverter stage 105 and the filter circuit 110 cooperate to suppress voltage transients and EMI/RFI disturbances. The output circuits 130 may include a clamp stage connected downstream of switch circuit 125 to eliminate any residual voltage transients prior to passing the filtered power to the connected equipment. Optionally, control circuit 135 may selectively connect and disconnect the clamp stage to and from the neutral conductor in unison with operating switch circuit 125 to protect components of the clamp stage. A diverter stage for incorporating into input circuits 105, the filter circuit 110, and a clamp stage for incorporating into output circuits 130 can be similar to those disclosed in U.S. Pat. No. 5,136,455, for example, the disclosure of which is hereby incorporated herein by reference in its entirety. It is to be understood that additional circuitry may be incorporated into input circuits 105 and output circuits 130 without departing from the spirit and intended scope of the present invention.

Control circuit 135 may include a processor 150 (e.g., a microprocessor, a microcontroller, a digital signal processor, etc.) capable of executing program instructions (i.e., software) for carrying out various operations and tasks, such as, for example, interpreting received data and commands from a communication module 140, coordinating control and messaging operations between components of control circuit 135, performing computations, causing information to be stored, and operating switch circuit 125.

Control circuit 135 may include a storage unit 155, such as a digital memory, which may be segmented into a code segment and a data segment. The code segment may have processor instructions stored therein that, when executed by processor 150, implement the functionality of the monitor 100. The data segment may have stored therein, among other things, information defining over voltage and under voltage conditions, event count information, timing information, and other data or information, as will be explained further below. While control circuit 135 may be implemented by a programmed microprocessor that executes stored software, an alternative processing environment may be implemented, such as a fixed data processing element, e.g., an application specific integrated circuit (ASIC), as will be readily recognized by the ordinarily skilled artisan. Other possible data processing environments include one or more field programmable logic devices, or a combination of fixed processing elements, firmware, and/or programmable logic devices. Storage unit 155 may include non-volatile memory, such as magnetic or optical media or flash memory, configured to persistently store data, including event data, such as that pertaining to the example events described below, and other information, such as anomaly counts, time stamps, non-changing variables, device ID, etc., over power cycles of monitor 100, such as when power has been removed therefrom.

Control circuit 135 may include a user interface (UI) 145 for local control and operation thereof. UI 145 may include various indicators, e.g., light-emitting diodes (LEDs), user controls, e.g., buttons, switches, etc., and/or a display. The combination of these interface devices and suitable software can be combined to implement a graphical UI, or GUI. For example, the display can be any of a variety of display mechanisms (e.g., an LCD display, an LED display, etc.) that provides a visual indication of power monitoring information and can be located, for example, along a portion of the outer housing or casing of monitor 100. The interface devices can be operably coupled with information on the display to select data, operate graphical controls, input data and commands, etc. The present invention is not limited to a particular interface architecture of local UI 145 and various user interfaces can be used in conjunction with the present invention without departing from the spirit and intended scope thereof.

Control circuit 135 may include a switch driver 160 to provide a drive signal by which switch circuit 125 changes conductive state. Processor 150 may provide a signal, representatively illustrated at signal path 153, to switch driver 160 based upon an evaluation of one or more power quality criteria. For example, processor 150 may receive the representation of the line-to-neutral voltage $V_{ln}$, such as from conditioning circuit 115, to determine whether a power anomaly exists in the AC circuit between the power source and the load. As used herein, a power anomaly is a deviation of voltage or current beyond a prescribed range. In certain embodiments of the present invention, such range may be established and modified, even remotely, at the discretion of a human operator, as is described in detail below. Once such a determination has been made, processor 150 may take appropriate action, such as activating switch circuit 125 into a conductive or non-conductive state.

Monitor 100 may include a communication module 140 to transmit and receive, modulate and demodulate, and code and decode data formatted per the communication specifications of communication channel 165. The present invention is not limited to a particular communication protocol, numerous variations of which may be used in conjunction with the present invention without departing from the spirit and intended scope thereof. In certain embodiments of the present invention, communication channel 165 may be a direct wired connection, such as a serial data connection, a connection in a circuit-switched or packet-switched communication system, and/or a modulated light beam in an optical path. In such a channel, monitor 100 may communicate with an external device. As illustrated in FIG. 1, monitor 100 may be communicatively coupled to a remote access device 170, which may be any suitable device having communication capability compatible with communication module 140, where such capability is representatively illustrated by communication module 176. Remote access device 170 may have a processor 172 and storage 174 by which a communication device may be implemented, where such communication device may be a computer, a mobile computing device, a cellular phone and the like. Remote access device 170 may embody a user interface 180 comprising a suitable display 182 and user controls 184. Additionally, processor 172 may execute instructions stored in storage 174 that implement a control application by which monitor 100 can be remotely operated and controlled. The ordinarily skilled artisan will recognize and appreciate the full range of devices, communication techniques and control applications that can be utilized in conjunction with the present invention upon review of this disclosure.

Supply voltage sample signal $V_{In}$ of monitor 100 may be an analog DC signal proportional to the input line-to-neutral supply voltage, which may be compared to various stored action criteria, such as threshold values: $OV_{restore}$ (over voltage restore), $OV_{report}$ (over voltage report), $OV_{shutdown}$ (over voltage shutdown) $UV_{restore}$ (under voltage restore), $UV_{report}$ (under voltage report), and $UV_{shutdown}$ (under voltage shutdown). These threshold values may be stored as variable data in storage unit 155 and processor 150 may retrieve these data for purposes of analysis, such as to determine whether the supply voltage level is within the prescribed range. By way of example, for a U.S. single-phase power supply, default threshold values may be set to the following supply voltage levels:

| | |
|---|---|
| $OV_{shutdown}$ ($OV_{sh}$) | 150 Vrms |
| $OV_{report}$ ($OV_{rc}$) | 135 Vrms |
| $OV_{restore}$ ($OV_{rs}$) | 130 Vrms |
| $UV_{restore}$ ($UV_{rs}$) | 105 Vrms |
| $UV_{report}$ ($UV_{rc}$) | 100 Vrms |
| $UV_{shutdown}$ ($UV_{sh}$) | 80 Vrms |

Figure 2:
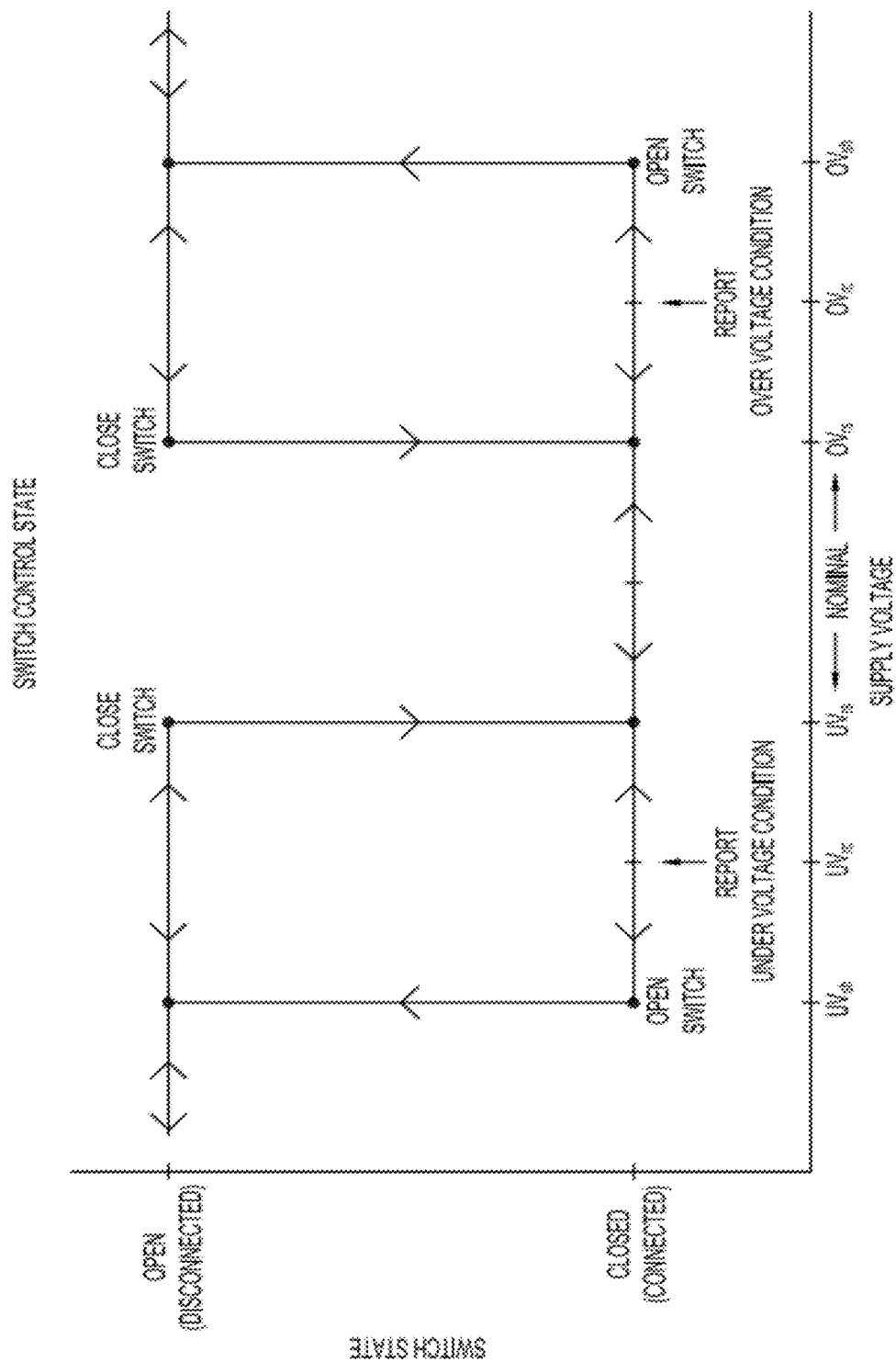
FIG. 2 is a graph illustrating the switch circuit state of the monitoring device of FIG. 1 as a function of supply voltage levels.
Figure 3:
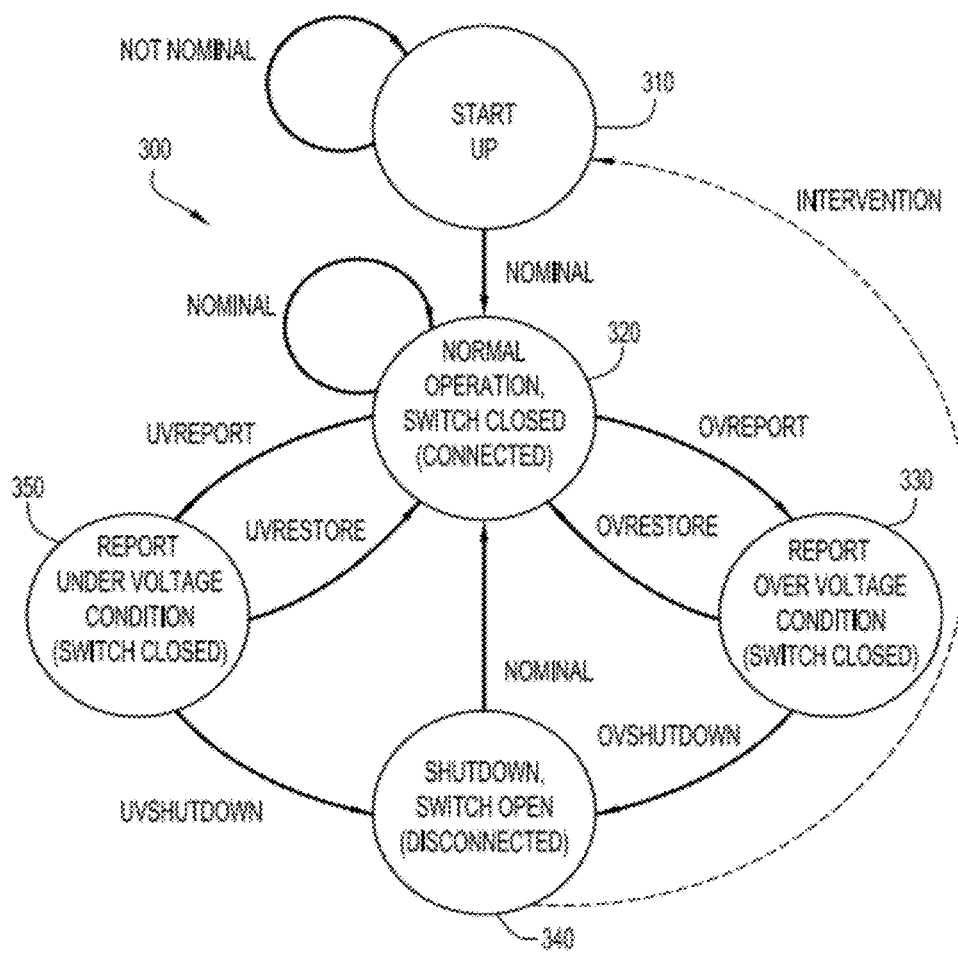
FIG. 3 is an illustration of an exemplary state machine that transitions between operational states upon certain power anomaly events.

FIG. 2 illustrates exemplary switch circuit state transition boundaries of monitor 100 as a function of supply voltage levels, the description of such operation is made with additional reference to the state machine of FIG. 3, which illustrates operational states of monitor 100. That is, a state transition in state machine 300 illustrated in FIG. 3 occurs when the supply voltage crosses the transition boundaries $UV_{sh}$, $UV_{rc}$, $UV_{rs}$, $OV_{rs}$, $OV_{rc}$ and $OV_{sh}$ illustrated in FIG. 2. The operators <, >, ≤, and ≥ are employed in the following description to illustrate an exemplary comparison between the supply voltage signal $V_{In}$ and the various thresholds. However, it is to be understood that the present invention is not limited to any particular power quality criteria or the assessment of such. For example, a threshold need not be crossed; other quality criterion need only be met. Additionally, while voltages are used in FIGS. 2 and 3 as the example process variable, similar states and state transitions may be defined for current and other process variables as dictated by the implementation for which the invention is embodied. The ordinarily skilled artisan will recognize the wide range of evaluation criteria that can be implemented as part of an embodiment of the present invention without departing from the spirit and intended scope thereof. The nominal operating voltage range for a piece of equipment may be established from manufacturer's specifications and may be set as parameters in monitor 100. For example, the nominal operating range may be set between over voltage and under voltage restore threshold levels ($OV_{rs}$ and $UV_{rs}$), as illustrated in FIG. 2. In this range, the switch circuit 125 may be placed in a conducting state by control circuit 135. An exemplary nominal range for a typical single-phase AC load may be between 105 Vrms to 130 Vrms and these values may be stored as $OV_{rs}$ and $UV_{rs}$ to define boundaries that encompass the nominal supply voltage level of 120 Vrms.

FIG. 3 depicts a state machine 300 that can be implemented by an electronic circuit in control circuit 135, such as by processor 150. At each state, one or more actions are performed, including compelling switch circuit 125 into a conductive or non-conductive state and reporting power anomalies that compelled a change of state in state machine 300. State machine 300 changes state upon occurrence of an anomaly event, i.e., the crossing of a state transition boundary. When $V_{In}$ falls below $UV_{rc}$ it is said that a UVReport event has occurred and when $V_{In}$ falls further to cross $UV_{sh}$, it is said that a UVShutdown event has occurred. When $V_{In}$ increases to cross $UV_{rs}$, it is said that a UVRestore event has occurred. If $V_{In}$ continues to increase to cross $OV_{rc}$, it is said that an OVReport event has occurred and when a continued increase in $V_{In}$ crosses $OV_{sh}$, it is said that an OVShutdown event has occurred. When $V_{In}$ decreases to cross $OV_{rs}$, it is said that an OVRestore event has occurred. As used herein, the state of state machine 300 defines the state of monitor 100.

From a Start-Up state (state 310 in FIG. 3), monitor 100 may transition to Normal Operation if supply voltage signal $V_{In}$ is acceptable (i.e., between the over voltage and under voltage restore thresholds, $UV_{rs}$ and $OV_{rs}$, a level referred to herein as Nominal), then control circuit 135 executes an "on-cycle" routine that transitions state machine 300 to a Normal Operation State 320. In this case, control circuit 135 supplies to switch circuit 125 a switch control signal $V_{sw}$ at an "on" level that compels switch circuit 125 into the conductive state. This switch control state is reflected in the lower middle portion of FIG. 2, where the switch state is closed (connected/conductive) and the supply voltage signal $V_{In}$ is between $UV_{rs}$ and $OV_{rs}$, i.e., Nominal.

If, in the Start-Up state, the supply voltage signal $V_{In}$ is outside of the restore threshold levels (i.e., $V_{In} > OV_{rs}$ or $V_{In} < UV_{rs}$), then state machine 300 loops and continues to test the supply voltage signal $V_{In}$ until it is Nominal and, at that point, state machine 300 transitions to the Normal Operation State 320.

In the Normal Operation State 320, control circuit 135 continues to periodically compare $V_{In}$ against the transition boundary levels to determine whether the supply voltage is Nominal or whether some over voltage or under voltage condition has developed. Referring again to FIG. 3, if the supply voltage signal $V_{In}$ rises beyond $OV_{rc}$ to cause an OVReport event, state machine 300 responds by transitioning to the Report Over Voltage Condition State 330, whereby an "over voltage report" routine may be executed. A count of such over voltage events may be stored in storage unit 155 of control circuit 135. The over voltage report routine includes incrementing the over voltage count and storing the incremented count value. Further, the over voltage report routine determines the time at which the OVReport event occurred and reports this temporal value. The reported time can be an elapsed time since the last event, an elapsed time since the beginning of a timing period or interval, or a time of day. Optionally, control circuit 135 can send a display control signal to UI 145 to display the incremented over voltage count value. Further, via communication channel 165, control circuit 135 may send a message to an external device, such as access device 170, containing the OVReport event information (e.g., count value and timing information).

In the Report Over Voltage State 330 shown in FIG. 3, control circuit 135 maintains the switch circuit 125 in the closed (conductive) state and the load equipment remains connected to the AC power supply despite the occurrence of the OVReport event. This conductive switch state is illustrated in the lower right portion of FIG. 2. As the supply voltage exceeds beyond over voltage restore level (OV$_{rs}$), no action is taken and switch circuit 125 remains closed (conductive). If the supply voltage signal continues to rise and exceeds the over voltage report threshold OV$_{rc}$, the over voltage report routine is executed (e.g., increment count, report time, control display, supply external notification); however, the switch control signal supplied to switch circuit 125 remains in the on (conductive) state (i.e., the switch control signal causes switch circuit 125 to continue to be closed).

It is possible that the supply voltage may fluctuate above and below the over voltage report threshold (OV$_{rc}$) over a short period of time. Accordingly, to prevent a rapid series of over voltage reports, the supply voltage signal must drop back below the over voltage restore threshold (an OVRestore event), compelling state machine 300 to return to Normal Operation State 320 before another over voltage report operation can be executed in response to an additional OVReport event. In other words, once monitor 100 is in the Report Over Voltage Condition State 330, no further over voltage conditions will be reported unless monitor 100 first returns to the Normal Operation State 320 and a subsequent OVReport event occurs or unless monitor 100 transitions to the Shutdown State 340, as described below. According to another possible implementation, once in the Report Over Voltage Condition State 330, the supply voltage signal V$_{In}$ can be periodically evaluated and, if the supply voltage signal remains above the over voltage report threshold (OV$_{rc}$), another over voltage report routine can be executed, resulting in periodic reports.

Referring again to FIG. 3, from the Report Over Voltage Condition State 330, state machine transitions into Shutdown state 340 when an OVShutdown event occurs, i.e., if the supply voltage signal V$_{In}$ rises above the over voltage shutdown threshold (V$_{In}$>OV$_{sh}$), then device 100 transitions to the Shutdown State 340. In this state, in addition to again executing the over voltage report routine, control circuit 135 also executes an "off-cycle" routine in which the switch control signal V$_{sw}$ changes to an off state, causing switch circuit 125 to switch to the non-conductive or "off" state (open), thereby disconnecting power to the device output receptacles and protected equipment. For example, in the case of an electromagnetic relay switch, control circuit 135 will signal switch driver 160 to remove relay coil current, causing the normally-open relay contacts of the relay to open, thereby disconnecting AC power to downstream components and connected equipment. This operation is reflected in the rightmost portion of the switch state graph of FIG. 2 in which switch circuit 125 transitions from a conductive/closed (equipment connected) state to a non-conductive/open (equipment disconnected) state.

According to one option, OV Shutdown events in which the supply voltage signal exceeds the over voltage shutdown threshold (V$_{In}$>OV$_{sh}$) can be reported separately from OVReport events, e.g., two different over voltage counts can be maintained, one corresponding to the OVReport event and one corresponding to the OVShutdown event.

As shown in FIG. 3, once monitor 100 is in the Shutdown State 340 (after execution of the off-cycle routine), switch circuit 125 remains non-conductive/open even if the supply voltage signal V$_{In}$ continues to fall below the over voltage shutdown threshold level OV$_{sh}$ or even if the supply voltage signal V$_{In}$ falls below the over voltage report threshold level OV$_{rc}$. To transition back to the Normal Operation State 320, the supply voltage signal V$_{In}$ must drop to at least below OV$_{rs}$ to Nominal before control circuit 135 will once again execute the on-cycle routine to close switch circuit 125. Since switch circuit 125 opens when the supply voltage signal V$_{In}$ exceeds the over voltage shutdown threshold OV$_{sh}$, but does not close until the supply voltage signal V$_{In}$ falls below the over voltage restore threshold OV$_{rs}$, state machine 300 operates through hysteresis, which prevents rapid on-and-off cycles in response to fluctuating supply voltage levels.

Similarly, if from the Normal Operation State 320, the periodically monitored supply voltage signal V$_{In}$ falls below the under voltage report threshold UV$_{rc}$ (an UVReport event), state machine 300 transitions into the Report Under Voltage Condition State 350, whereby an under voltage report routine is executed. A count of under voltage events is stored in storage unit 155. The under voltage report routine includes incrementing the under voltage count and storing the incremented count value. Further, the under voltage report routine determines the time at which the UVReport event occurred. As with the over voltage events, the reported under voltage event time can be, an elapsed time since the last event, an elapsed time since the beginning of a timing period or interval, or a time of day. Optionally, control circuit 135 can send a display control signal to UI 145 to display the incremented under voltage count value. Further, via communication channel 165, control circuit 135 can send a message to remote access device 170 containing the under voltage event information (e.g., count value and timing information).

In the Report Under Voltage State 350 shown in FIG. 3, switch circuit 125 remains conductive/closed and the load equipment remains connected to the AC power supply despite an under voltage event being reported. This switch state can be seen in the bottom left portion of FIG. 2. As the supply voltage signal V$_{In}$ falls below the under voltage restore threshold UV$_{rs}$, no action is taken and switch circuit 125 remains closed (connected). If the supply voltage signal continues to fall below the under voltage report threshold UV$_{rc}$ (a UVReport event), the under voltage report routine is executed (e.g., increment count, report time, control display, supply external notification). However, the switch control signal V$_{sw}$ supplied to switch circuit 125 remains in the on (conductive) state.

It is possible that the supply voltage signal level may fluctuate above and below the under voltage report threshold (UV$_{rc}$) over a short period of time. To prevent this condition from generating a rapid series of under voltage reports, the supply voltage signal V$_{In}$ must exceed the under voltage restore threshold (V$_{In}$>UV$_{rs}$), to compel monitor 100 into Normal Operation State 320, followed by a subsequent UVReport condition in order for an additional report to be generated. In other words, once monitor 100 is in the Report Under Voltage Condition State 350, no further under voltage conditions will be reported unless monitor 100 first returns to the Normal Operation State 320 and then again transitions to the Report Under Voltage Condition State 350 or unless monitor 100 transitions to the Shutdown State 340. According to another possible implementation, once in the Report Under Voltage Condition State 350, the supply voltage signal V$_{In}$ can be periodically evaluated and, if the supply voltage signal remains below the under voltage report threshold ($UV_{rc}$), another under voltage report routine can be executed, resulting in periodic reports.

Referring again to FIG. 3, if the supply voltage signal falls below the under voltage shutdown threshold ($V_{In} < UV_{sh}$) from the Report Under Voltage Condition State 350 causing a UVShutdown event, then monitor 100 transitions to the Shutdown State 340. In this case, in addition to again executing the under voltage report routine, control circuit 135 also executes an off-cycle routine in which the switch control signal $V_{sw}$ changes to an off state, causing switch circuit 125 to transition to a non-conductive state. This operation is reflected in the leftmost portion of the switch state graph of FIG. 2 in which switch circuit 125 transitions from a conductive/closed (equipment connected) state to an non-conductive/open (equipment disconnected) state.

According to one option, UVShutdown events in which the supply voltage signal falls below the under voltage shutdown threshold ($V_{In} < UV_{sh}$) can be reported separately from UVReport events, e.g., two different under voltage counts can be maintained, one corresponding to the UVShutdown event and one corresponding to the UVReport event.

Once monitor 100 is in the Shutdown State 340 (after execution of the off-cycle routine), switch circuit 125 remains non-conductive/open even if the supply voltage signal $V_{In}$ exceeds the under voltage shutdown threshold $UV_{sh}$ or even if the supply voltage signal $V_{In}$ exceeds the under voltage report threshold $UV_{rc}$. To transition back to the Normal Operation State 320, the supply voltage signal $V_{In}$ must rise to Nominal, i.e., $UV_{rs} \leq V_{In} \leq OV_{rs}$ before control circuit 135 will once again compel switch circuit 125 into the conductive stated (closed). Since switch circuit 135 shuts off when the supply voltage signal $V_{In}$ falls below the under voltage shutdown threshold $UV_{sh}$ but does not turn back on until the supply voltage signal $V_{In}$ exceeds the under voltage restore threshold $UV_{rs}$, state machine 300 operates under hysteresis to prevent rapid on-and-off cycles in response to fluctuating supply voltage levels.

In certain embodiments, once state machine 300 is in Shutdown State 340, it must reenter the Start-Up State through an Intervention Condition, as illustrated in FIG. 3. For example, if attempts to return to the Nominal state are unsuccessful, user intervention may be required and, until such occurs, the state machine will remain in Shutdown State 340. Once the condition has been cleared, the user may perform an action associated with the Intervention Condition, at which time state machine 300 enters the Start-Up State 310.

In certain embodiments, the level of deviation from a nominal value of a process variable may establish the severity of the corresponding event and the corresponding action may reflect the severity. For example, if a process variable is enclosure temperature in and around monitor 100, increasingly established temperature thresholds may compel increasingly significant action. For example, measured enclosure temperature crossing one temperature threshold may compel a report being generated and stored, a greater temperature may result in an audible alarm and a still greater temperature may compel disconnection of all loads from the supply voltage. Such a scheme is illustrated in FIG. 2 as well, where the level of deviation from a nominal measured parameter level compels first an action of lower severity, i.e., a report being generated, and then an action of greater severity, i.e., power being disconnected from the load. The scheme of FIG. 2 may be extended to include other parameters as well, such as temperature, energy consumption, supply voltage, load current, etc. The ordinarily skilled artisan will recognize other such schemes that may be used in conjunction with the present invention upon review of this disclosure.

Figure 4A:
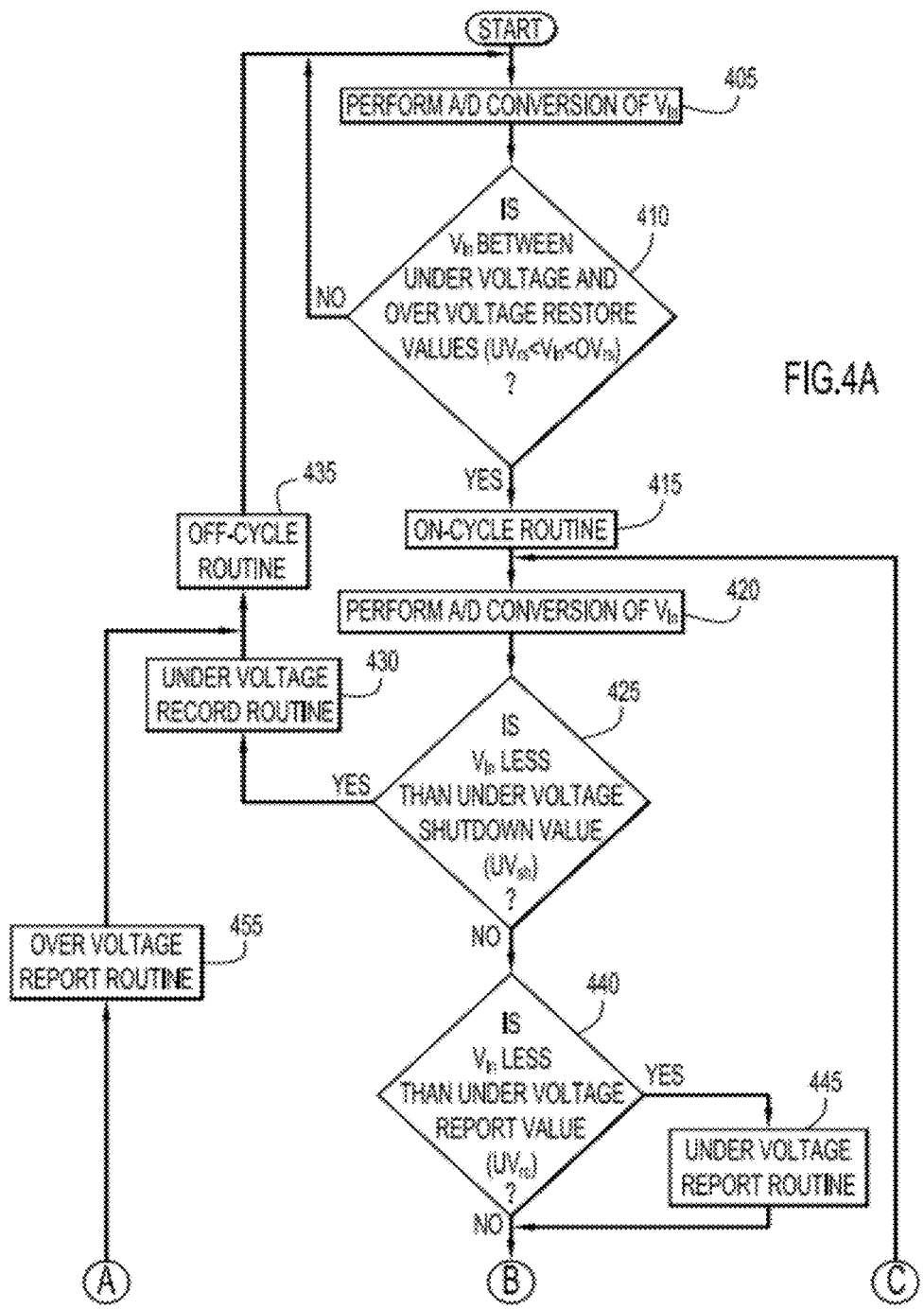
FIGS. 4A and 4B depict a functional flow diagram of one example of logic for implementing operation of the monitoring device of FIG. 1 in response to supply voltage conditions.
Figure 4B:
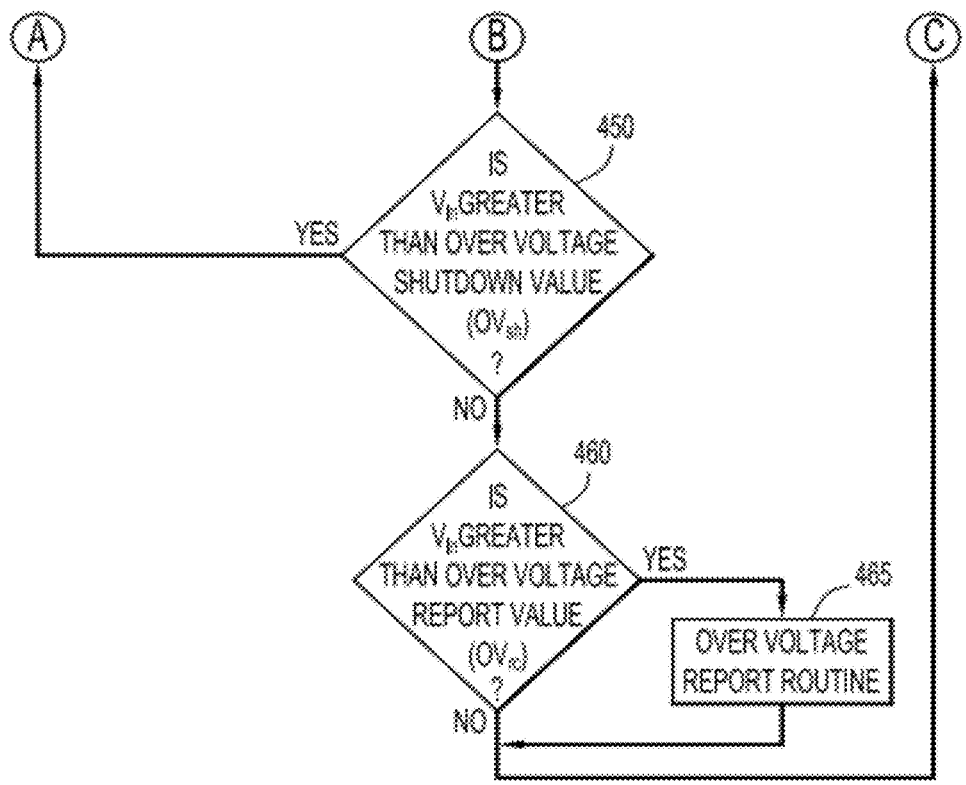

FIGS. 4A and 4B depict a functional flow diagram summarizing one example of logic for implementing operation of monitor 100 in response to supply voltage conditions. In operation 405, from a Start-Up condition, an A/D conversion of the received supply line-to-neutral voltage representation $V_{In}$ is performed by control circuit 135. It is determined in operation 410 whether the digital supply voltage signal $V_{In}$ is between the under voltage and over voltage restore threshold values ($UV_{rs} \leq V_{In} \leq OV_{rs}$). If so, the on-cycle routine (operation 415) is performed in which control circuit 135 operates switch circuit 125 into an on (conductive) state (i.e., the Normal Operation State). If not (i.e., if the supply voltage signal $V_{In}$ is outside of the restore threshold levels ($V_{In} > OV_{rs}$ or $V_{In} < UV_{rs}$), then the logic loops back to operation 405 and control circuit 135 continues to test the supply voltage signal $V_{In}$ until it is within these acceptable levels (i.e., $UV_{rs} \leq V_{In} \leq OV_{rs}$). Once Vln is Nominal, the on-cycle routine may be executed and monitor 100 transitions to the Normal Operation State.

After execution of the on-cycle routine, A/D conversion continues to be periodically performed on the received supply voltage signal $V_{In}$ (operation 420). In operation 425, the supply voltage signal is compared to the under voltage shutdown threshold value $UV_{sh}$. If the supply voltage signal is less than the under voltage shutdown threshold ($V_{In} < UV_{sh}$), then the under voltage report routine (operation 430) and the off-cycle routine (operation 435) are executed to report the under voltage condition as described above and to compel switch circuit 125 into an off (non-conductive) state to disconnect the input line conductor L to the output line conductor L'. After execution of the off-cycle routine, the logic returns to the initial operation 405 in which the supply voltage signal $V_{In}$ is periodically compared to the restore thresholds.

If in operation 425 the supply voltage signal is not below the under voltage shutdown threshold ($V_{In} \geq UV_{sh}$), then the logic proceeds to operation 440 in which the voltage supply is compared to the under voltage report threshold value $UV_{rc}$. If the supply voltage signal is less than the under voltage report threshold ($V_{In} < UV_{rc}$), then the under voltage report routine (operation 445) is executed to report the under voltage condition as described above and the logic proceeds to operation 450 (FIG. 4B). If the supply voltage signal is not less than the under voltage report threshold ($V_{In} \geq UV_{rc}$), then the logic proceeds directly to operation 450 without performing the under voltage report routine.

In operation 450, the supply voltage signal is compared to the over voltage shutdown threshold value $OV_{sh}$. If the supply voltage signal is greater than the over voltage shutdown threshold ($V_{In} > OV_{sh}$), then the over voltage report routine (operation 455) and the off-cycle routine (operation 435) are executed to report the over voltage condition as described above and to cause switch circuit 125 to turn off (non-conductive) state to disconnect the input supply line conductor L to the output load line conductor L'. After execution of the off-cycle routine, the logic returns to the initial operation 405 in which the supply voltage signal $V_{In}$ is periodically compared to the restore thresholds.

If, in operation 450, the supply voltage signal is not greater than the over voltage shutdown threshold ($V_{In} \leq OV_{sh}$), then the logic proceeds to operation 460 in which the voltage supply is compared to the over voltage report threshold value $OV_{rc}$. If the supply voltage signal is greater than the over voltage report threshold ($V_{In} > OV_{rc}$), then the over voltage report routine (operation 465) is executed to report the over voltage condition as described above and the logic proceeds to operation 420 to repeat the comparison cycle with the switch circuit remaining in the closed (connected) state. If, in operation 460, the supply voltage signal is not greater than the over voltage report threshold ($V_{In} \le OV_{rc}$), then the logic proceeds directly to operation 420 without performing the over voltage report routine.

FIG. 5 depicts a functional flow diagram of another example of logic for implementing operation of monitor 100 in response to supply voltage conditions. In operation 505, from a Start-Up condition, an A/D conversion of the received supply line-to-neutral voltage representation $V_{In}$ is performed. It is determined in operation 510 whether the supply voltage signal $V_{In}$ is between the under voltage and over voltage restore threshold values ($UV_{rs} \le V_{In} \le OV_{rs}$). If so, the on-cycle routine (operation 515) is performed in which control circuit 135 compels switch circuit 125 into an on (conductive) state to connect the input supply line conductor L to the output load line conductor L', (i.e., the Normal Operation State). If not (i.e., if the supply voltage signal $V_{In}$ is outside of the restore threshold levels ($V_{In} > OV_{rs}$ or $V_{In} < UV_{rs}$), then the logic loops back to operation 505 and control circuit 135 continues to test the supply voltage signal $V_{In}$ until it is within these acceptable levels (i.e., $UV_{rs} \le V_{In} \le OV_{rs}$ or Nominal) before it executes the on-cycle routine and transitions to the Normal Operation State.

After execution of the on-cycle routine, A/D conversion continues to be periodically performed on the received supply voltage signal $V_{In}$ (operation 520). In operation 525, the voltage supply is compared to the under voltage report threshold value $UV_{rc}$. If the supply voltage signal is less than the under voltage report threshold ($V_{In} < UV_{rc}$), then the under voltage report routine (operation 530) is executed to report the under voltage condition as described above and the logic proceeds to operation 535 in which the supply voltage signal is compared to the under voltage shutdown threshold value $UV_{sh}$. If the supply voltage signal is less than the under voltage shutdown threshold ($V_{In} < UV_{sh}$), then the off-cycle routine (operation 540) is executed to report the under voltage condition as described above and to cause switch circuit 125 to turn off (non-conductive state) to disconnect the input supply line conductor from the output load line conductor. If control circuit 135 separately tracks $V_{In}$ falling below the under voltage shutdown threshold from $V_{In}$ falling below the under voltage report threshold, then control circuit 135 may also execute the under voltage report routine (not shown in FIG. 5) along with the off-cycle routine. After execution of the off-cycle routine, the logic returns to the initial operation 505 in which the supply voltage signal $V_{In}$ is periodically compared to the restore thresholds.

If, in operation 535, the supply voltage signal is greater than the under voltage shutdown threshold ($V_{In} \ge UV_{sh}$), then the logic loops back to operation 520 to repeat the comparison cycle between the supply voltage signal and the various thresholds, with the switch circuit remaining in the closed (conductive) state.

If in operation 525 the supply voltage signal is not less than the under voltage report threshold ($V_{In} \ge UV_{rc}$), then the logic proceeds to operation 545 in which the supply voltage signal is compared to the over voltage report threshold value $OV_{rc}$. If the supply voltage signal is greater than the over voltage report threshold ($V_{In} > OV_{rc}$), then the over voltage report routine (operation 550) is executed to report the over voltage condition as described above and the logic proceeds to operation 555 in which the supply voltage signal is compared to the over voltage shutdown threshold value $OV_{sh}$. If the supply voltage signal is greater than the over voltage shutdown threshold ($V_{In} > OV_{sh}$), then the off-cycle routine (operation 540) is executed to report the over voltage condition as described above and to cause switch circuit 125 to turn off (non-conductive state) to disconnect the input supply line conductor from the output load line conductor. If control circuit 135 separately tracks $V_{In}$ exceeding the over voltage shutdown threshold from $V_{In}$ exceeding the over voltage report threshold, then control circuit 135 may also execute the over voltage report routine (not shown in FIG. 5) along with the off-cycle routine. After execution of the off-cycle routine, the logic returns to the initial operation 505 in which the supply voltage signal $V_{In}$ is periodically compared to the restore thresholds.

If, in operation 555, the supply voltage signal is not greater than the over voltage shutdown threshold ($V_{In} \le OV_{sh}$), then the logic loops back to operation 520 to repeat the comparison cycle between the supply voltage signal and the various thresholds, with the switch circuit remaining in the closed (conductive) state.

If, in operation 545, the supply voltage signal is not greater than the over voltage report threshold ($V_{In} \le OV_{rc}$), then the logic loops back to operation 520 to repeat the comparison cycle between the supply voltage signal and the various thresholds with the switch circuit remaining in the closed (conductive) state. It will be appreciated from FIGS. 4A, 4B, and 5 that the invention is not limited to any one specific implementation, and a variety of different logic operations can be carried out to implement the invention.

Having separate report and shutdown levels allows for the reporting of over and under voltage conditions that may be disruptive to connected equipment (i.e., creating a history of over and under voltage events) without actually disconnecting power to connected equipment (i.e., shutting down connected equipment). Supply voltage levels that may be damaging to connected equipment (i.e., outside the shutdown thresholds) can be addressed by reporting the event and disconnecting and protecting connected equipment.

As shown in FIG. 1, communication module 140 allows control circuit 135 to transmit information such as the status of monitor 100 and event history (e.g., over voltage and under voltage counts) to an external device, such as remote access device 170 for storage and analysis. In addition to transmitting data from monitor 100 to an external device, communication module 140 allows for transmission of data, such as device control parameters, action criteria, etc., from an external device to monitor 100. In one embodiment, for instance, monitor 100 can be interfaced to a computer executing an application which, among other things, allows the end user to select from a list of over and under voltage threshold levels. These user-selected thresholds are then transmitted to control circuit 135. Control circuit 135 then replaces or overwrites previous used or default thresholds with the end user selected thresholds. Because monitor 100 is designed to protect a variety of sensitive equipment, this feature allows the end-user to customize the report and shutdown thresholds to be compatible with connected equipment.

According to another feature, control circuit 135 can also be programmed to perform routines in response to interrupts. In one implementation, control circuit 135 is configured, using an onboard timer module, to perform an "increment time" routine upon a timer interrupt, such as every 1 second. In this case, control circuit 135 executes the operations shown in the flowchart of FIGS. 4A-4B or FIG. 5 and is interrupted every second to perform an "increment time" routine, which keeps track of elapsed time (seconds, minutes, hours, and days) since the most recent reported power anomaly event. Thus, in response to one of the above anomaly events, in addition to incrementing and storing the applicable event count, control circuit 135 also stores the elapsed time since the previous event (i.e., time between events).

By using communication module 140 to connect control circuit 135 to a computer running custom diagnostic software, the event data (event count and elapsed time between events) can be analyzed, displayed, and stored. By reporting the elapsed time between the most recent event and connection to the computer, the custom diagnostic software can perform computations on previously reported events and convert the reported time between events to actual time/date of occurrence (time stamp).

It will be appreciated that the above-described control circuit 135 represents just one possible implementation, and numerous other approaches employing a variety of hardware, software, firmware, and combinations thereof can be used to evaluate and respond to over voltage conditions and under voltage conditions.

As discussed above, control circuit 135 can monitor other types of process variables for system faults, disturbances or irregularities. For example, control circuit 135 can also evaluate whether there is a wiring fault such as an open ground or a reverse polarity condition (i.e., line and neutral reversed). Further, over temperature conditions and over current conditions can be monitored by control circuit 135. Actions corresponding to these process variables can be appropriately taken when the corresponding action criteria have been met, e.g., control circuit 135 can increment the relevant occurrence counts and store the counts in memory. Optionally, control circuit 135 can display information about the events on UI 145 (e.g., the type of wiring fault, etc.). When appropriate, control circuit 135 can also signal switch circuit 125 to disconnect power from the device output receptacles and protected equipment. In response, switch circuit 125 makes or breaks continuity of the line conductor with the connected equipment on the load side depending on whether one of the undesirable operating conditions has been detected (e.g., an overvoltage condition, an undervoltage, a wiring fault, an over-temperature condition, an over-current condition, etc.).

Storage unit 155 may include processor instructions stored on a non-transitory computer readable medium (i.e., software) that can be executed by processor 150. As used herein, the term "computer readable medium" refers to non-transitory (tangible) media (e.g., memory or storage devices). Storage unit 155 is a tangible processor-readable or computer-readable memory that stores or is encoded with instructions that, when executed by the processor of control circuit 135, cause the processor to perform the functions described herein.

Figure 6:
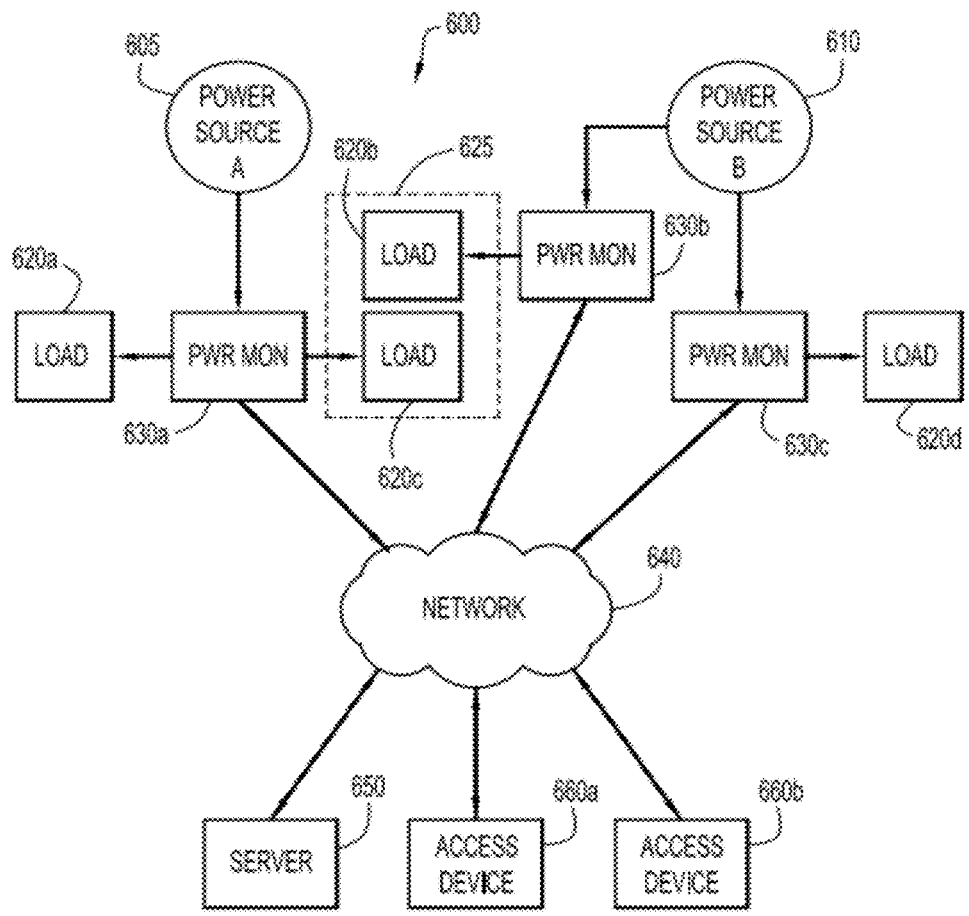
FIG. 6 is a schematic block diagram of a distributed power monitoring embodiment.

An exemplary power monitoring system 600 is illustrated in FIG. 6 and comprises a plurality of power monitors, individually illustrated at power monitors 630a-630c and representatively referred to as power monitor 630. Power monitor 630 may be implemented by a circuit suitable to embody the present invention, such as by monitor 100. Each monitor 630 may be electrically coupled to a load, individually illustrated at loads 620a-620d and representatively referred to as load 620, and to a corresponding power source, representatively illustrated at power sources 605 and 610. In the illustrated embodiment of FIG. 6, each monitor 630 monitors the power supplied by the power source 605, 610 to which it is connected for power anomalies and selectively connects such power to the load 620 to which it is connected. In that each load 620 may have its own power requirements that must be met by the power source to which it is connected, each monitor 630 may be individually set to establish suitable control for each load 620 based on the power source 605, 610 to which it is connected. In certain applications, loads 620 may be co-located and drawing supply power from, for example, a commercial power grid 610 and by, for example, a generator 605. Additionally, a particular device 625 may be supplied by multiple power sources, e.g., both power grid 610 and generator 605 and monitoring of both sources against their respective loads 620 may be essential to proper operation of device 625. To monitor and control distributed loads 620, each monitor 630 may be communicatively coupled to a central, possibly roving administration point. In one such implementation, each monitor 630 may be accessible to one or more access devices, individually illustrated as access devices 660a-660b and representatively referred to as access device 660, by way of a connection constructed in network 640. Such access may be achieved by an application executing on access device 660, which itself may be implemented by a suitable communication device, such as remote access device 170 illustrated in FIG. 1. Alternatively, each monitor 630 may be communicatively coupled to a central server 650 and access device 660 may access monitors 630 through server 650.

Figure 7:
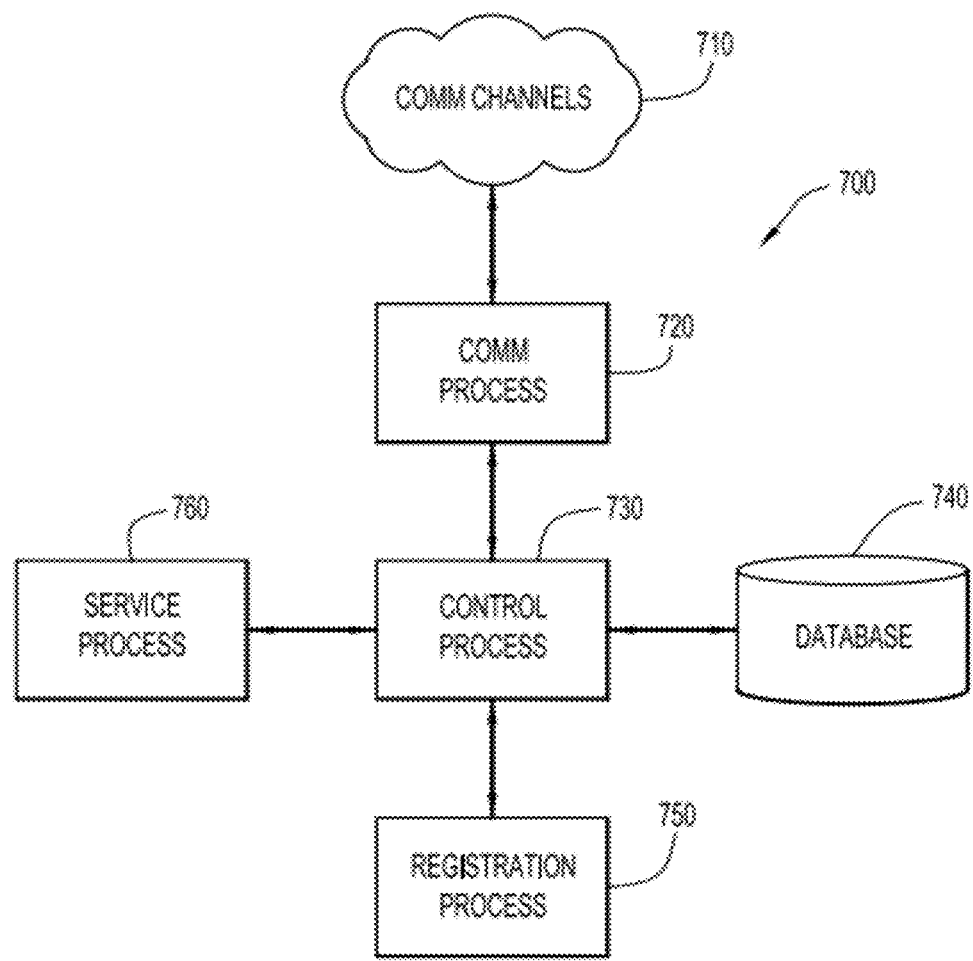
FIG. 7 is a schematic block diagram of an access system by which one or more monitor devices may be accessed.

FIG. 7 illustrates an exemplary access system 700 by which a remote access device 660 may communicate with and control monitors 630. Access system 700 may be implemented on individual access devices 660 and/or on server 650. Additionally, access system 700 may be distributed over individual access devices 660 and server 650, where certain functions are implemented on the access device 660 and other functions implemented on server 650. The present invention is not limited to a particular implementation of access system 700, but for purposes of explanation and not limitation, it will be assumed that access system 700 is carried out through processor instructions executed by processor 172. The ordinarily skilled artisan will recognize numerous alternatives to that described herein and the present invention is intended to encompass all such alternatives.

Access system 700 may include a control process 730 to coordinate the interoperation of other functional components therein. For example, control process 730 may receive formatted data from one functional module, decode information regarding the destination of such data, and pass the data to the functional module for which it is intended. Additionally, control process 730 may format data destined to be stored in database 740 in a manner by which it can be readily retrieved, such as through various data structures and lookup tables, and passed to a requesting module. Control process 730 may also track data, implement timers, schedule processes for execution and other such functions so that a fully functional access system 700 may be carried out. The ordinarily skilled artisan will recognize numerous variations by which a control process may be carried out without departing from the spirit and intended scope of the present invention.

Communication process 720 may provide services by which access system 700 communicates with monitors 630. Such services may include, without limitation, modulating and demodulation channel data, i.e., data carried in communications channels 710, and coding and decoding such data. In certain embodiments, communication process 720 may also encrypt and decrypt channel data so as prevent unauthorized access to distributed monitor system 600. Communication process 720 may perform other communications-related tasks per the application in which the present invention is embodied, as the skilled technician will understand and appreciate.

Access system 700 may include a registration process 750 by which monitors 630 are registered as being a member of monitor system 600. For example, as described in more detail below, remote UI 180 may provide user controls by which details of individual monitors 630 may be collected in a manner by which each monitor 630 can be accessed. Such details may be suitably formatted and stored in database 740 and recalled when, by manipulation of a user control in remote UI 180, access to the registered monitor is requested. Responsive to such registration, a record may be created in database 740 to contain not only monitor identification, location and access data, but control data, such as current and past threshold levels as well.

A service process 760 may be implemented in access system 700 to provide specific services related to presenting controls such as data entry GUI elements, accepting data from a user by way of such controls, displaying report data and the like. Certain of such services as well as other functionality of access system 700 are described in the paragraphs that follow with reference to different controls and protocols by which such functionality is carried out.

Figure 8:
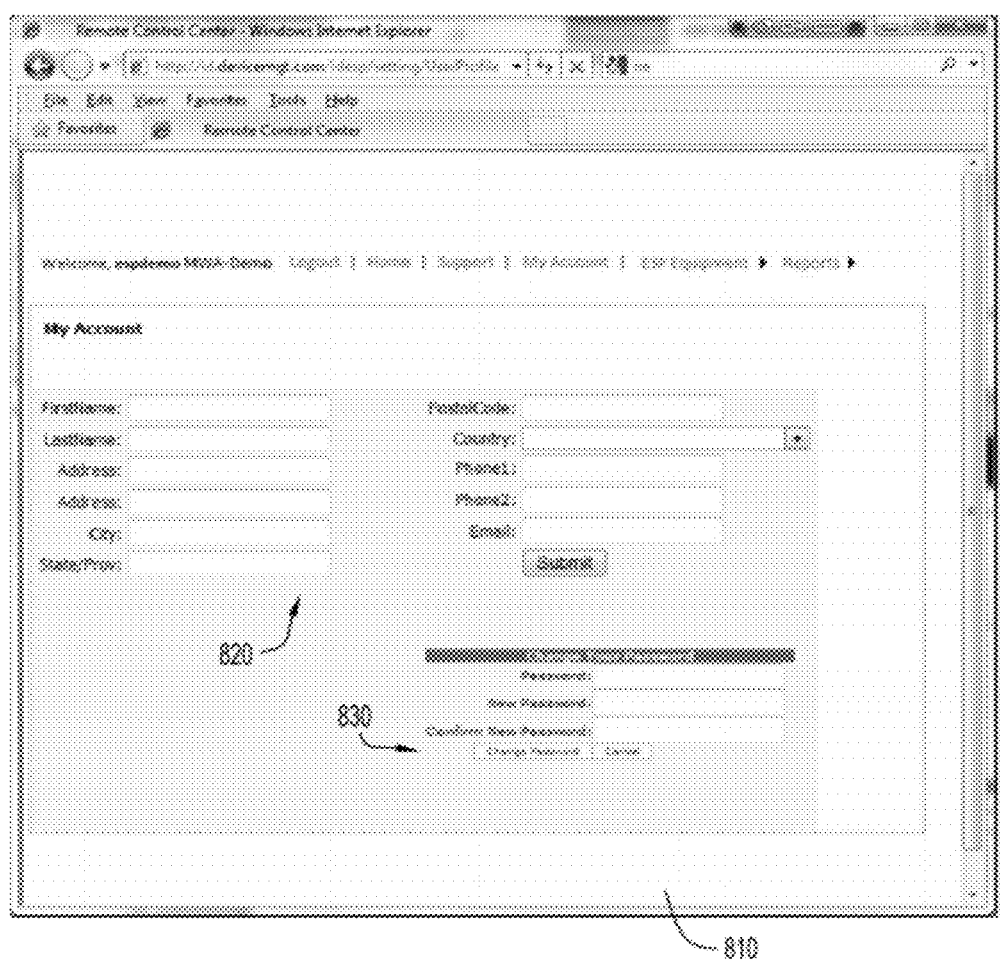
FIG. 8 is an exemplary screen shot illustrating how a user account can be created.

FIG. 8 illustrates an exemplary account creation panel 810 by which a user may create a user account. In certain embodiments, a user account allows secured access to centralized services provided by a server, such as server 650. In other embodiments, a user account is created on access device 660 to secure access to distributed monitor system 600. As illustrated in FIG. 8, account creation panel 810 includes data entry fields 820 by which user information is entered. Registration process 750 may create an account record, such as in database 740, under which monitor devices 630 and authorized access devices 660 may be recorded and associated with the account. Additionally, account creation panel 810 may include data entry fields 830 by which a unique password may be created and associated with the user account. The created password may be used to prohibit access to the user account and the distributed monitor system 600 established thereunder, as well as being used as a key to encrypt data stored and transmitted over communication channels in network 640.

Figure 9:
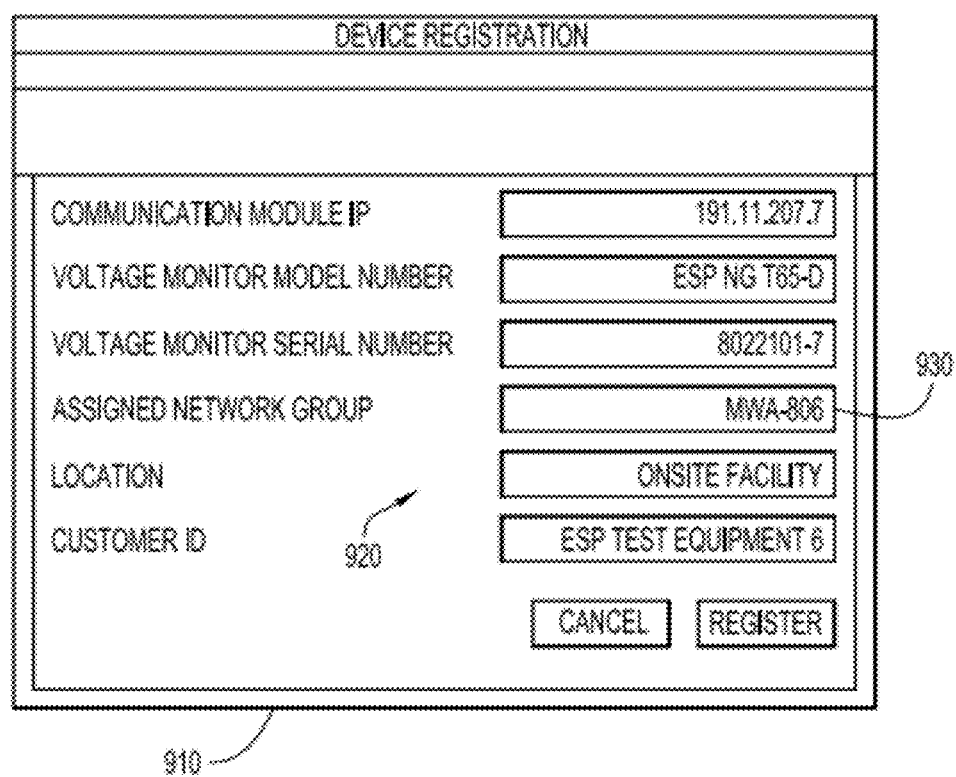
FIG. 9 is an illustration of an exemplary user interface component by which a monitoring device may be registered under a user account.

FIG. 9 illustrates an exemplary device registration panel 910, by which a user may register individual monitor devices 630 under an account or to simply to place control of a particular monitor 630 under access controls of an account holder. As illustrated in the figure, device registration panel 910 includes data entry fields 920 by which device-specific data identifying a particular monitor 630 are entered. Registration process 750 may associate the device data entered in with the device registration control 930 with the user account. Additionally, the device registration panel 910 may include one or more data entry fields 930 by which selected monitors 630 may be grouped as a logical entity, such as monitor system 600. Accordingly, monitors 630 belonging to a network group can be readily identified and controlled in a distributed control scheme.

In certain embodiments of the present invention, a user account may include a homepage from which navigation of additional controls is afforded. It is to be understood that while the homepage may be provided by a Web server, such is not necessary and the homepage need not be compliant with the Hypertext Transfer Protocol (HTTP) and formatted in Hypertext Markup Language (HTML). Such is also true for other control pages described herein, despite such pages being illustrated as those that would be implemented HTML/HTTP over the Internet.

Figure 10:
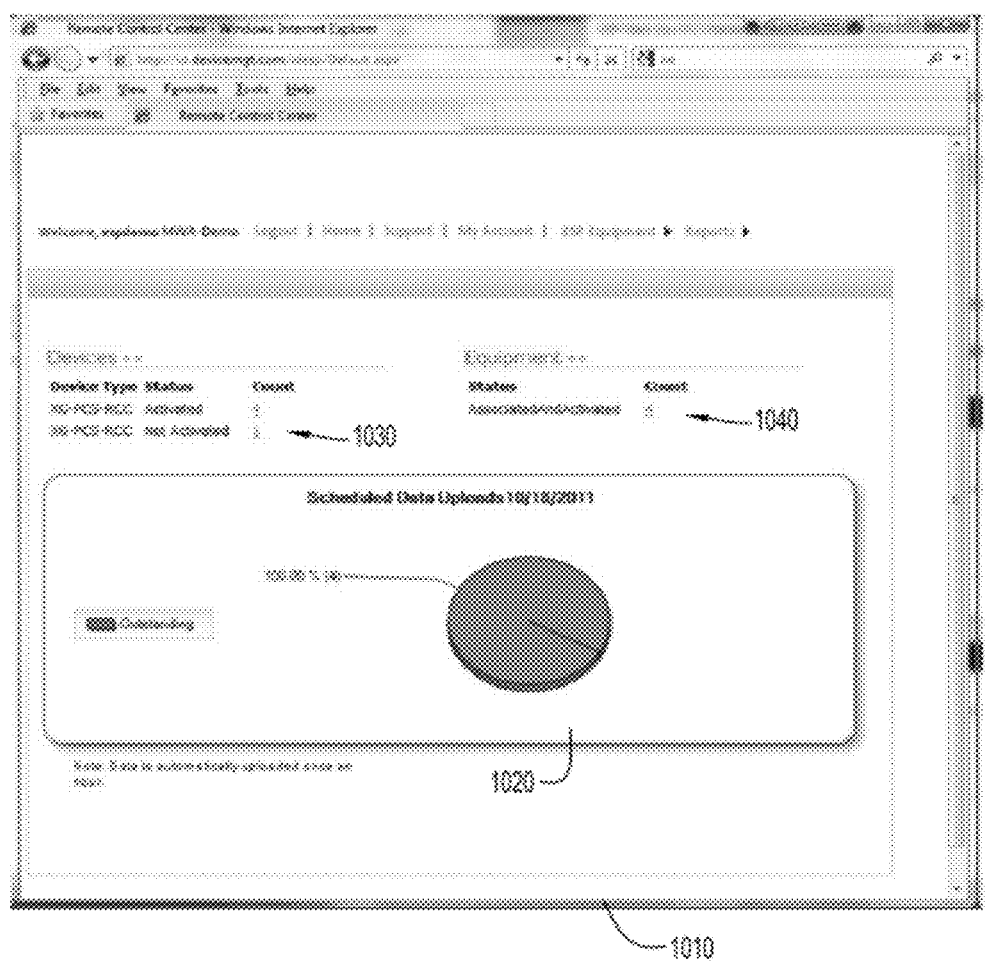
FIG. 10 is an exemplary screen shot illustrating how summary data of a power control system are presented.

An exemplary homepage 1010 is illustrated in FIG. 10, which may be presented to the user after successful logon. As illustrated in the figure, homepage 1010 may include status indicators 1030 indicating the number of communication modules 140 that are reachable by the access device 170. In certain embodiments of the present invention, communication module 140 is a device separate from the monitor circuitry and is coupled to a communication port, such as a serial port, on monitor 630. Indicators 1030, then, indicate the number of registered communication modules 140, and indicators 1040 may indicate the number of communication modules that are associated and in communication with a power monitor 630.

In certain embodiments of the present invention, action criteria data and other data are uploaded to various monitors 630 at specific, predetermined time intervals. A user control 1020 may be provided on homepage 1010 or elsewhere that indicate the status of such uploads. Additional information may be provided regarding what data has been transferred to which monitor and at what time. This may be stored as part of the record for the device in database 740.

Figure 11:
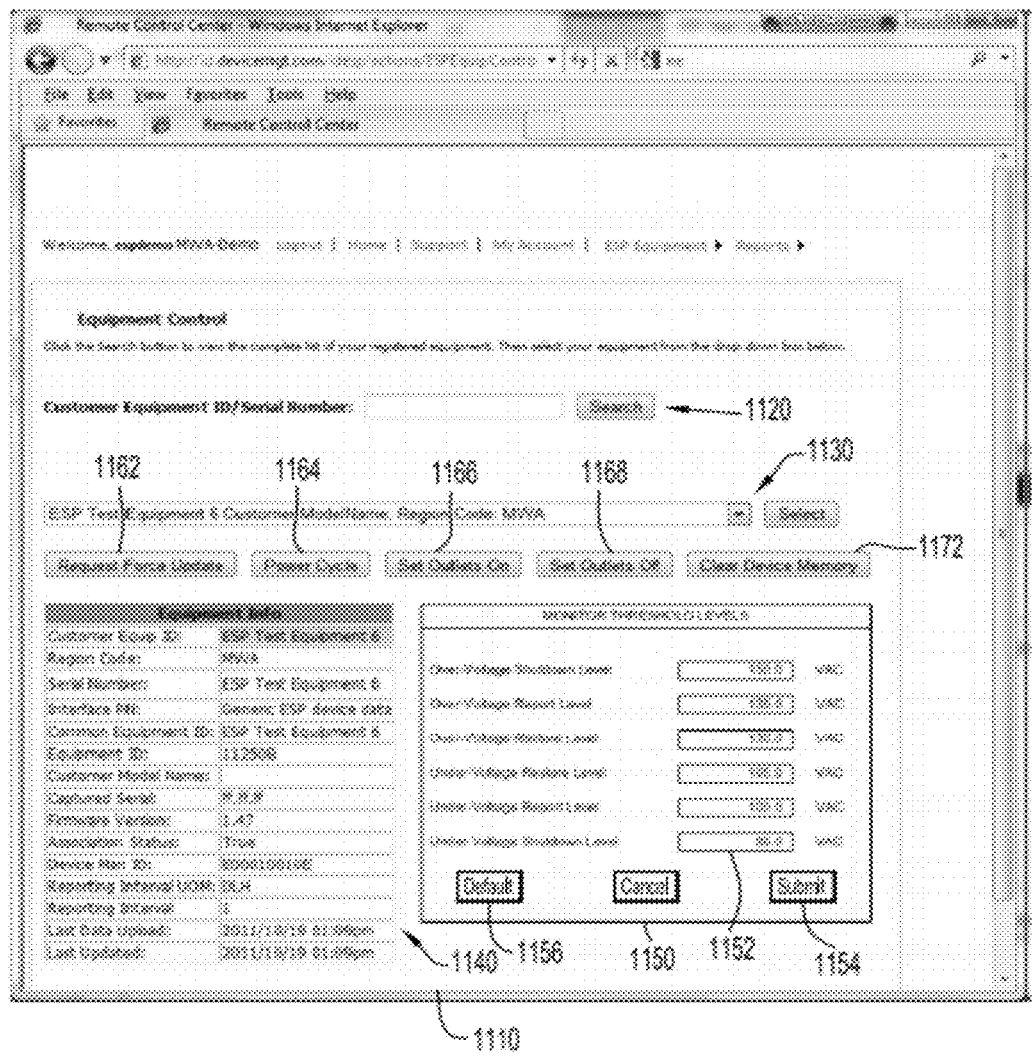
FIG. 11 is an exemplary screen shot illustrating how action criteria data of a monitoring device can be established.

FIG. 11 depicts an exemplary equipment control panel 1110 on which multiple user controls are disposed for controlling monitors 630. Each control on equipment control panel 1110 may compel service process 760 to perform associated services on a particular monitor 630. Monitors 630 can be accessed either by performing a search through a search control 1120 in which registered monitors 630 are located. Alternatively, user control 1130 may recall records from all available monitors associated with a user account. Once a particular monitor 630 has been located, device specific details of the monitor 630 are displayed in a display panel 1140. Additionally, the communication channel between the access device 660 and the monitor 630 may be established, and/or reestablished, to compel some associated action on the selected monitors 630 in response to settings on equipment control panel 1110. For example, activating Request Force Update control 1162 compels transfer of action criteria data over the communication channel to the selected monitor 630 immediately as opposed to at the next update cycle. Power Cycle control 1164 compels a power cycle on the selected monitor, e.g., deactivating switch circuit 125 such that power is not delivered to a connected load and reactivating switch circuit 125 after a predetermined time interval, such as 90 seconds. Set Outlets On control 1166 compels monitor 630 to activate switch circuit 125 regardless of the presence or absence of a power anomaly. Similarly, Set Outlets Off control 1168 compels deactivation of switch circuit 125 regardless of the state of the controlling state machine. Clear Device Memory control 1172 compels a clearing of monitor memory containing event data without affecting action criteria data that may be stored therein.

Equipment control panel 1110 may further include user controls 1150 by which action criteria data are entered and transmitted to a selected monitor 630. The action criteria data may then be used by monitor 630 to configure the transition boundaries of state machine 300. In the illustrated embodiment, the action criteria data are threshold levels that define OVShutdown, OVReport, OVRestore, UVrestore, UVReport and UVShutdown events on which state machine 300 transitions between states. A user may enter new values for the threshold levels in the data entry fields representatively illustrated by data entry field 1152, and transmitted to the selected monitor 630 upon activating Submit control 1154. Additionally, a user may reset the threshold values to the default thresholds via a command control (for such,) representatively illustrated at Default button 1156.

Figure 12:
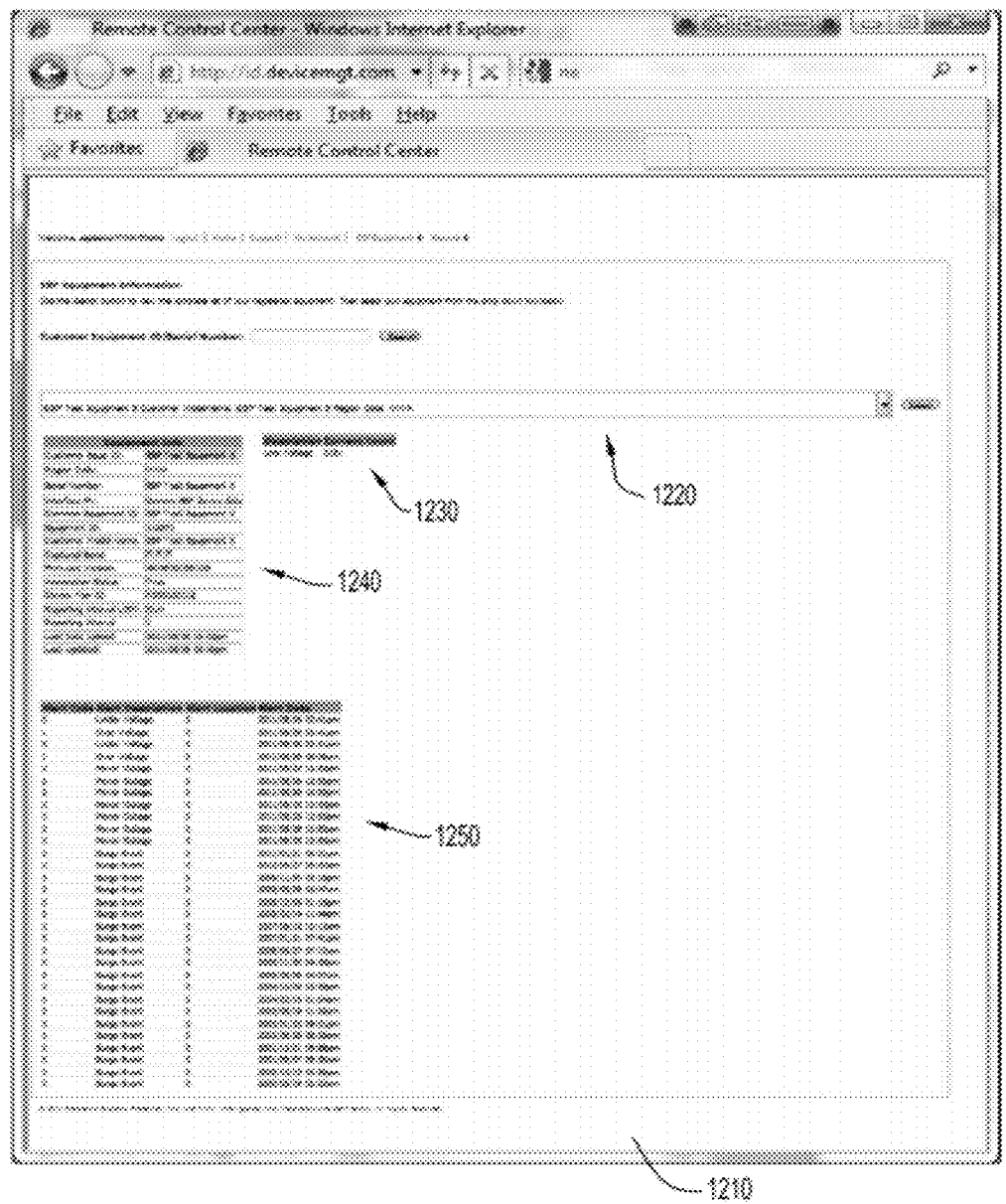
FIG. 12 is an exemplary screen shot illustrating how power anomaly data are presented.

An exemplary equipment information panel 1210 is illustrated in FIG. 12 and includes a device selection control 1220 similar to that discussed with reference to FIG. 11. Upon selection of a monitor, access device 660 retrieves information from the selected monitor 630. Such information may include, without being limited to a line voltage measurement 1230, which is the measured line voltage as of the most recent polling of the monitor and other pertinent information in panel 1240. The information panel 1240 may include captured serial number of the selected monitor, its firmware version, the date and time the most recent power quality event data was reported, the date/time of the most recent data download. Additionally, in panel 1250, individual power quality events may be listed with the most recent event located at top. The event type and the date and time at which the event occurred are displayed in panel 1250.

Figure 13:
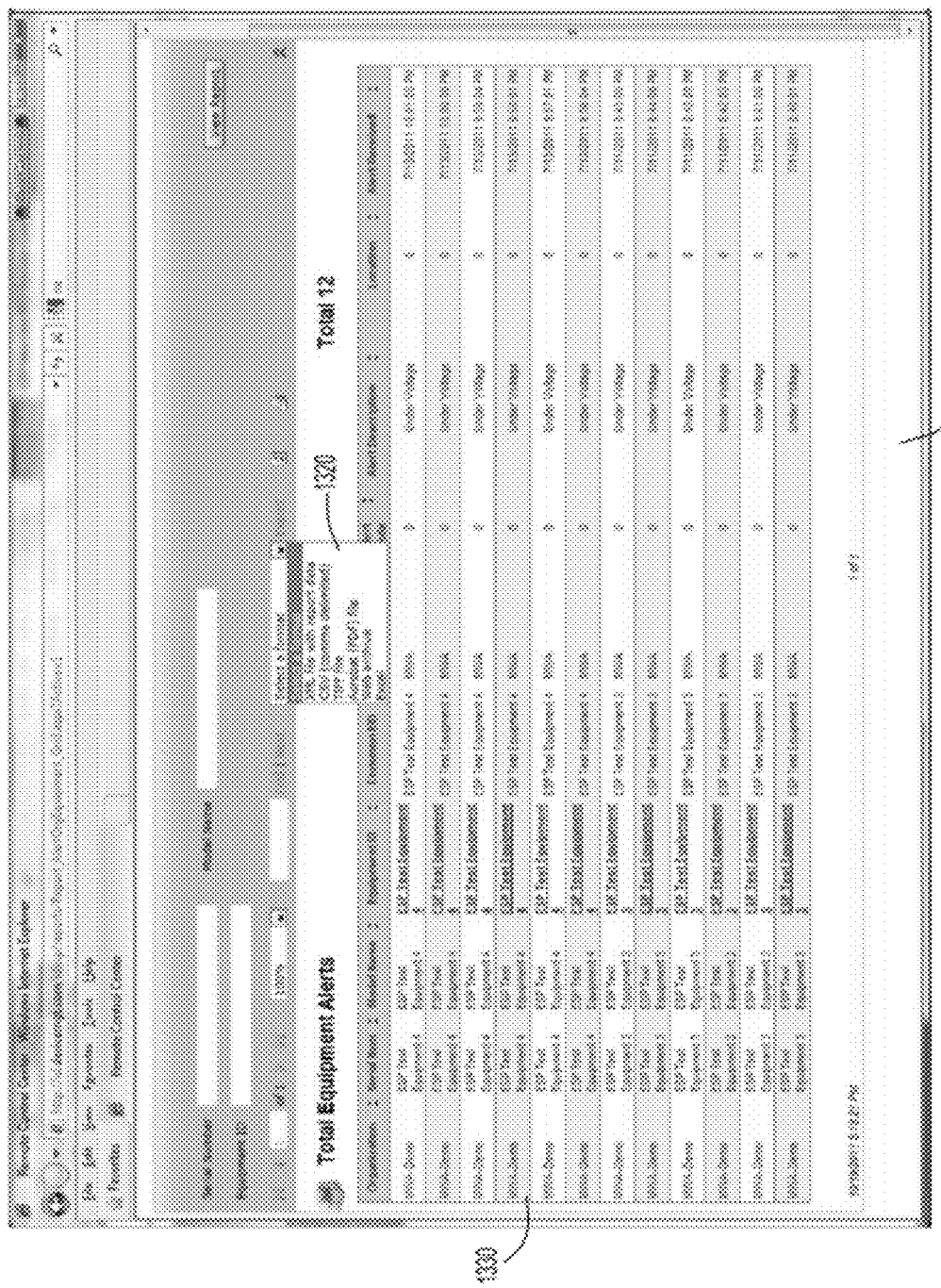
FIG. 13 is an exemplary screen shot illustrating how generated reports are presented.

FIG. 13 illustrates an exemplary report panel 1310 by which information across a distribution of monitors 630 can be viewed. Report panel 1310 may provide a device inventory for all monitors registered under the user account and any alerts that may have been issued. Reports may be provided to third parties by selecting a format by control 1320 and sending the formatted report by, say, email. In certain embodiments, such sending of reports may be automatic. Reports may be generated by alerts per location, per model number and other set configurations. The present invention is not limited to the data included in the report and such reports may include other data beyond anomaly reports discussed above.

Figure 14A:
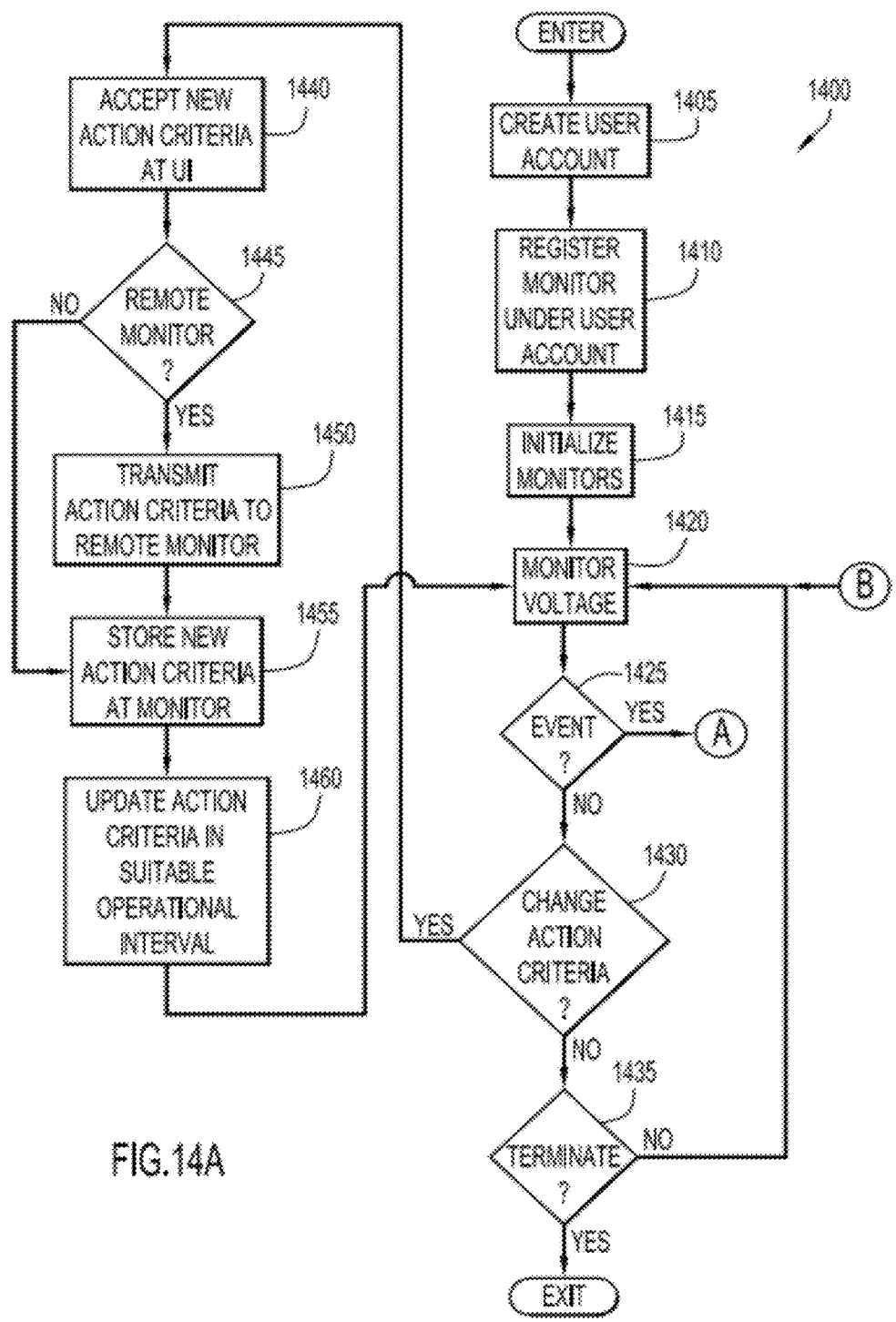
FIGS. 14A-14B depict a flow diagram of an exemplary user control process by which one or more power monitors can be accessed and controlled.
Figure 14B:
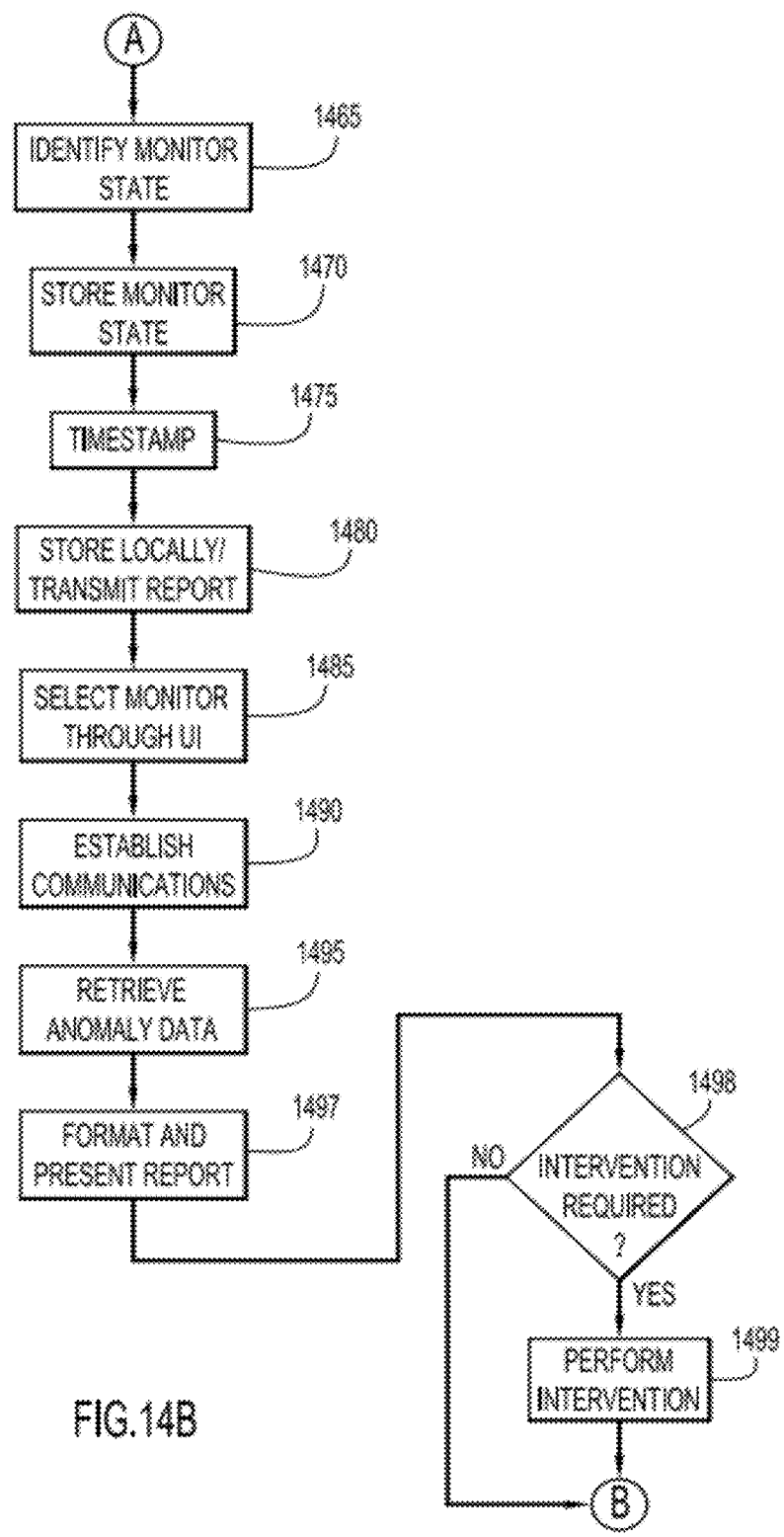

FIGS. 14A-B depict a exemplary power control process 1400 by which one or more power monitors 630 may be controlled by a user interface either locally or remotely. A user may create a user account in operation 1405 under which one or more power monitor(s) 630 may be registered, as illustrated at operation 1410. In operation 1415, monitors 630 are initialized with action criteria data assigned thereto through, for example, the user interface. Each monitor monitors input power in accordance with the action criteria data in operation 1420. If an event occurs during such monitoring, as illustrated in operation 1425, the process transitions to operation 1465 in FIG. 14B, whereby the state of the monitor is identified. That is, a power anomaly causes a transition in the state of the monitor, i.e., the anomaly event, and the state after such transition provides the reason why such transition took place. The monitor state is then stored in operation 1470 and time stamped in operation 1475. Report data are stored locally in operation 1480 and may additionally be transmitted to outside entities per some predetermined report schedule. Additionally, as illustrated in operation 1485, a particular monitor may be selected by the user interface at which point communications between the access device and the selected monitor are established in operation 1490. The access device may retrieve anomaly report data from the power monitor in operation 1495 and a report may be generated and presented by the user interface in operation 1497. In operation 1498, it is determined whether user intervention is required to correct the condition that resulted in the event. If so, such user intervention is performed in operation 1499 and process 1400 may then return to monitor operation 1420.

Operation 1430 of FIG. 14A may determine whether the action criteria data are to be changed and if so such new parameters may be accepted by the user interface in operation 1440. It is then determined whether the selected monitor being controlled is one that is remote from the access device in operation 1445 and, if so, the new action criteria data are transmitted to the remote monitor in operation 1450. The new action criteria data, whether transmitted in operation 1450 or otherwise, are stored in memory at the selected monitor in operation 1455 and the new parameters take effect at some convenient interval in operation 1460. In operation 1435, user control process 1400 may be terminated and, unless such is indicated, the monitors continue to operate in accordance with the action criteria data currently in effect.

Having described preferred embodiments of new and improved supply voltage monitor and control, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:
1. An apparatus comprising:
  at least one power monitor comprising:
   a set of input terminals at which to receive input power and a set of output terminals at which to provide output power;
   a switch circuit electrically interposed between the input and output terminals and compelled into a conductive state and a non-conductive state in accordance with corresponding signal levels of a signal provided thereto; and
   a control circuit to transition between a plurality of controller states responsive to respective measured values of a process variable that includes an input voltage associated with the input power and to provide the signal to the switch circuit in accordance with levels of the input voltage assigned to the respective controller states to:
    control the switch circuit into the conductive state in response to the input voltage being within a nominal operating range set between a first over voltage threshold ($OV_{rs}$) and a first under voltage restore threshold ($UV_{rs}$) while the switch circuit is in the non-conductive state;
    control the switch circuit to remain in the conductive state in response to the input voltage exceeding a second over voltage threshold ($OV_{rc}$) that is higher than the first over voltage threshold ($OV_{rs}$) or the input voltage exceeding a second under voltage threshold ($UV_{rc}$) that is lower than the first under voltage threshold ($UV_{rs}$) while the switch circuit is in the conductive state; and
    control the switch circuit into the non-conductive state in response to the input voltage exceeding a third over voltage threshold ($OV_{sh}$) that is higher than the second over voltage threshold ($OV_{rc}$) or the input voltage exceeding a third under voltage threshold ($UV_{sh}$) that is lower than the second under voltage threshold ($UV_{rc}$) while the switch circuit is in the conductive state;

a database configured to store a record containing identification data selected by a user to identify the power monitor;
an access device remote from the power monitor and configured to obtain the identification data of the power monitor from the database, the access device including a user interface to accept action criteria data that define state transition boundaries on the process variable at which the control circuit transitions from one of the controller states to another of the controller states in accordance with the value of the process variable, the user interface further including a registration control by which the user associates the identification data with the power monitor in the record of the database to register the power monitor therein; and
a communication module in the power monitor and a communication module in the access device between which a communication channel is formed over which the action criteria data are transmitted, the communication channel being formed using the identification data of the power monitor obtained from the database.

2. The apparatus of claim 1, wherein the control circuit generates data indicative of an anomaly event when the control circuit is in one of the controller states, the anomaly event data being transmitted over the communication channel to the access device.

3. The apparatus of claim 2, wherein the user interface of the access device is configured to display the anomaly event data.

4. The apparatus of claim 1, wherein the user interface includes a selection control by which the record is retrieved from the database and the identification data therein is utilized to activate the communication channel between the power monitor and the access device.

5. The apparatus of claim 4, wherein the action criteria data define levels of deviation from a nominal power level in the input power received at the input terminals, each of the levels defining a corresponding one of the state transition boundaries.

6. The apparatus of claim 5, wherein the level of deviation from the nominal power level is determined from a measurement of input voltage.

7. The apparatus of claim 6, wherein the user interface includes a user control by which an input voltage level value for a state transition boundary is accepted from the user and included in the action criteria data.

8. The apparatus of claim 7, wherein the control circuit compels an action responsive to crossing of the state transition boundary by the input voltage other than compelling the switch into the non-conductive state.

9. The apparatus of claim 8, wherein the action is reporting a deviation from the nominal power level to the access device.

10. The apparatus of claim 4 further comprising:
a plurality of the power monitors, wherein the selection control on the user interface compels the retrieval of the record corresponding to one of the power monitors selected thereby and the identification data therein is utilized to activate the communication channel between the selected power monitor and the access device.

11. The apparatus of claim 10, wherein the record in the database for each of the power monitors includes a set of the action criteria data for the corresponding power monitor.

12. The apparatus of claim 11, wherein the user interface includes a configuration control by which the action criteria data for the power monitors are independently established.

13. The apparatus of claim 12, wherein the database includes a log associated with each of the records to record data indicative of a deviation of the input power from the nominal level for each of the corresponding power monitors.

14. The apparatus of claim 13, wherein the user interface includes a report control by which the log data are displayed for each of the power monitors.

15. The apparatus of claim 14, wherein the user interface displays the log data for more than one selected power monitors simultaneously.

16. An apparatus comprising:
a plurality of power monitors, each comprising:
a set of input terminals at which to receive input power and a set of output terminals at which to provide output power;
a switch circuit electrically interposed between the input and output terminals and compelled into a conductive state and a non-conductive state in accordance with corresponding signal levels of a voltage signal provided thereto; and
a processor to provide the signal to the switch circuit in accordance with a state of a state machine executed thereon, the state machine transitioning between a plurality of the states responsive to a user-specified power anomaly in the input power wherein the state machine is configured to:
control the switch circuit into the conductive state in response to the signal being within a nominal operating range set between a first over voltage threshold ($OV_{rs}$) and a first under voltage restore threshold ($UV_{rs}$) while the switch circuit is in the non-conductive state;
control the switch circuit to remain in the conductive state in response to the signal exceeding a second over voltage threshold ($OV_{rc}$) that is higher than the first over voltage threshold ($OV_{rs}$) or the signal exceeding a second under voltage threshold ($UV_{rc}$) that is lower than the first under voltage threshold ($UV_{rs}$) while the switch circuit is in the conductive state; and
control the switch circuit into the non-conductive state in response to the signal exceeding a third over voltage threshold ($OV_{sh}$) that is higher than the second over voltage threshold ($OV_{rc}$) or the signal exceeding a third under voltage threshold ($UV_{sh}$) that is lower than the second under voltage threshold ($UV_{rc}$) while the switch circuit is in the conductive state;
a database configured to store records containing identification data selected by a user to respectively identify the power monitors;
an access device remote from the power monitor and configured to obtain the identification data from the database, the access device including a user interface to accept action criteria data from a user from which boundaries defining the power anomalies are established, the user interface further including a registration control by which the user associates the identification data with the power monitor in the record of the database to register the power monitor therein; and
a communication module at the access device and at each of the power monitors through which a communication channel is constructed between the access device and at least one of the power monitors, the communication channel being constructed using the identification data obtained from the database.

17. The apparatus of claim 16, wherein the state machine transitions through the states that include at least one state that compels generation of the signal and at least another state that reports the power anomaly without compelling a change in the switch state to the non-conductive state.

18. The apparatus of claim 16, wherein the user interface of the access device includes:
a user control by which one of the power monitors is selected from the plurality of power monitors to provide the action criteria data to the selected power monitor.

19. The apparatus of claim 18 further comprising:
a user control on the user interface by which a user account is created under which identification data for respective power monitors is stored in the database.

20. The apparatus of claim 19 further comprising:
a server communicatively coupled to the power monitors through a communication network, the server controlling access to the identification data in the database through the user account.

21. The apparatus of claim 16, wherein access to the database is controlled by the access device.

22. The apparatus of claim 16, wherein the communication channel is formed in accordance with the Internet Protocol/Transport Control Protocol communication suite.

23. A method comprising:
registering a power monitor with a database through a registration control on a user interface of a remote access device, the registration storing a record in the database containing identification data selected by a user to identify a respective plurality of power monitors;
selecting the power monitor from the plurality of power monitors through the user interface of the remote access device;
retrieving the identification data identifying the selected power monitor from the database;
receiving action criteria data accepted from a user through the user interface of the remote access device by the power monitor through a communication channel formed using the retrieved identification data;
configuring a state machine on the selected power monitor from the action criteria data, wherein the state machine is configured to:
control the switch circuit into the conductive state in response to an input voltage being within a nominal operating range set between a first over voltage threshold ($OV_{rs}$) and a first under voltage restore threshold ($UV_{rs}$) while the switch circuit is in the non-conductive state;
control the switch circuit to remain in the conductive state in response to the input voltage exceeding a second over voltage threshold ($OV_{rc}$) that is higher than the first over voltage threshold ($OV_{rs}$) or the input voltage exceeding a second under voltage threshold ($UV_{rc}$) that is lower than the first under voltage threshold ($UV_{rs}$) while the switch circuit is in the conductive state; and
control the switch circuit into the non-conductive state in response to the input voltage exceeding a third over voltage threshold ($OV_{sh}$) that is higher than the second over voltage threshold ($OV_{rc}$) or the input voltage exceeding a third under voltage threshold ($UV_{sh}$) that is lower than the second under voltage threshold ($UV_{rc}$) while the switch circuit is in the conductive state;
compelling a state transition in the state machine when the input voltage, associated with the input power of the selected power monitor, is outside the nominal operating range; and
selectively providing the input power to a load connected to the selected power monitor in accordance with the state of the state machine.

24. The method of claim 23 further comprising:
transmitting the accepted action criteria data to the selected power monitor over the communication channel.

25. The method of claim 24 further comprising:
associating a set of the power monitors with the user through the record stored in a database;
establishing a plurality of the communication channels between the access device and the respective power monitors in the set thereof; and
receiving report data from each of the power monitors at the access device, the report data including data indicative of anomalies in the input power at each of the power monitors in the set thereof.

* * * * *